(12) United States Patent (10) Patent No.: US 8,188,655 B2
Yamazaki et al. (45) Date of Patent: *May 29, 2012

(54) LIGHT-EMITTING DEVICE AND ELECTRONIC DEVICES

(75) Inventors: Shunpei Yamazaki, Tokyo (JP); Yoshiharu Hirakata, Kanagawa (JP); Tetsuji Ishitani, Kanagawa (JP); Yasuo Nakamura, Tokyo (JP); Hisao Ikeda, Kanagawa (JP); Hiroki Ohara, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 34 days.

This patent is subject to a terminal disclaimer.

(21) Appl. No.: 12/793,225

(22) Filed: Jun. 3, 2010

(65) Prior Publication Data

US 2010/0252825 A1 Oct. 7, 2010

Related U.S. Application Data

(63) Continuation of application No. 11/001,024, filed on Dec. 2, 2004, now Pat. No. 7,750,552.

(30) Foreign Application Priority Data

Dec. 15, 2003 (JP) .................................. 2003-417382

(51) Int. Cl.
H01J 1/62 (2006.01)
(52) U.S. Cl. ......................... 313/506; 313/504; 313/512
(58) Field of Classification Search ........... 313/504–512
See application file for complete search history.

(56) References Cited

U.S. PATENT DOCUMENTS

| 6,559,594 | B2 | 5/2003 | Fukunaga et al. |
| 6,768,260 | B2 | 7/2004 | Fukunaga et al. |
| 6,801,185 | B2 | 10/2004 | Salley |
| 6,819,309 | B1 * | 11/2004 | Kishi .............................. 345/87 |
| 6,873,099 | B2 | 3/2005 | Maeda |
| 7,034,451 | B2 * | 4/2006 | Senbonmatsu ............... 313/498 |
| 7,101,242 | B2 | 9/2006 | Fukunaga et al. |
| 7,148,502 | B2 | 12/2006 | Yamazaki et al. |

(Continued)

FOREIGN PATENT DOCUMENTS

CN 1307442 C 8/2001

(Continued)

OTHER PUBLICATIONS

Office Action, Korean Application No. 2004-0106305, dated Apr. 20, 2011, 16 pages with English translation.

(Continued)

*Primary Examiner* — Peter Macchiarolo
(74) *Attorney, Agent, or Firm* — Fish & Richardson P.C.

(57) ABSTRACT

The present invention provides a lightweight, thin light-emitting device having a new structure which has a plurality of display screens. Further, the invention provides a dual emission type display device which can perform a pure black display and can achieve high contrast. According to the invention, at least, both electrodes of a light-emitting element (an anode and a cathode of a light-emitting element) are highly light-transmitting at the same level, and a polarizing plate or a circularly polarizing plate is provided, thereby conducting a pure black display that is a state of no light-emission and enhancing the contrast. Moreover, unevenness of color tones in displays of the both sides, which is a problem of a full-color dual emission type display device structure, can be solved according to the invention.

19 Claims, 17 Drawing Sheets

U.S. PATENT DOCUMENTS

| | | | |
|---|---|---|---|
| 7,157,156 B2 | 1/2007 | Raychaudhuri et al. | |
| 7,161,185 B2 | 1/2007 | Yamazaki et al. | |
| 7,199,520 B2 | 4/2007 | Fujii et al. | |
| 7,215,313 B2 | 5/2007 | Giraldo et al. | |
| 7,265,383 B2 | 9/2007 | Yamazaki et al. | |
| 7,333,077 B2 | 2/2008 | Koyama et al. | |
| 7,355,338 B2 | 4/2008 | Osame et al. | |
| 7,466,294 B2 | 12/2008 | Yamazaki et al. | |
| 7,834,538 B2 | 11/2010 | Yamazaki et al. | |
| 2002/0021088 A1 | 2/2002 | Howard et al. | |
| 2003/0151359 A1 | 8/2003 | Okada et al. | |
| 2003/0189401 A1* | 10/2003 | Kido et al. | 313/504 |
| 2004/0070809 A1* | 4/2004 | Senbonmatsu | 359/245 |
| 2004/0201545 A1 | 10/2004 | Yamazaki et al. | |
| 2004/0226200 A1 | 11/2004 | Salley | |
| 2004/0227159 A1 | 11/2004 | Nakashima et al. | |
| 2004/0227698 A1 | 11/2004 | Yamazaki et al. | |
| 2004/0251823 A1 | 12/2004 | Park et al. | |
| 2004/0263056 A1 | 12/2004 | Seo et al. | |
| 2004/0263066 A1 | 12/2004 | Abe et al. | |
| 2004/0263069 A1 | 12/2004 | Yamazaki et al. | |
| 2005/0024293 A1 | 2/2005 | Sakata et al. | |
| 2005/0024339 A1 | 2/2005 | Yamazaki et al. | |
| 2005/0052348 A1 | 3/2005 | Yamazaki et al. | |
| 2006/0017380 A1 | 1/2006 | Fukunaga et al. | |
| 2006/0038488 A1 | 2/2006 | Fukunaga et al. | |
| 2007/0120475 A1 | 5/2007 | Ishitani et al. | |
| 2007/0197118 A1 | 8/2007 | Fukunaga et al. | |
| 2011/0037061 A1 | 2/2011 | Yamazaki et al. | |

FOREIGN PATENT DOCUMENTS

| | | |
|---|---|---|
| CN | 1397809 A | 2/2003 |
| EP | 1122800 A2 | 8/2001 |
| EP | 1684367 A3 | 7/2006 |
| EP | 1703568 A3 | 9/2006 |
| JP | 5242965 A | 9/1993 |
| JP | 9127885 A | 5/1997 |
| JP | 02761453 B2 | 6/1998 |
| JP | 10255976 A | 9/1998 |
| JP | 2001076882 A | 3/2001 |
| JP | 3174367 A | 6/2001 |
| JP | 2002040428 A | 2/2002 |
| JP | 2002372623 A | 12/2002 |
| JP | 2003531405 A | 10/2003 |
| JP | 2003332068 A | 11/2003 |
| JP | 2003345271 A | 12/2003 |
| JP | 2004-311077 A | 11/2004 |
| JP | 2005149945 A | 6/2005 |
| JP | 2005520193 A | 7/2005 |
| KR | 2002-0091787 A | 12/2002 |
| KR | 10-0382057 B1 | 7/2003 |
| WO | WO0180204 A2 | 10/2001 |
| WO | WO03077231 A2 | 9/2003 |

OTHER PUBLICATIONS

Chinese Office Action (Chinese Application No. 200410102044.1), mailed Apr. 4, 2008 with English translation (24 pages).

Yasuo Nakamura et al.; "2.1-inch QCIF+ Dual Emission AMOLED Display having Transparent Cathode Electrode"; SID 04 Digest; pp. 1403-1405; 2004.

* cited by examiner

FIG. 14B Folded State

FIG. 14D Folded State

FIG. 17A Cross Nicols
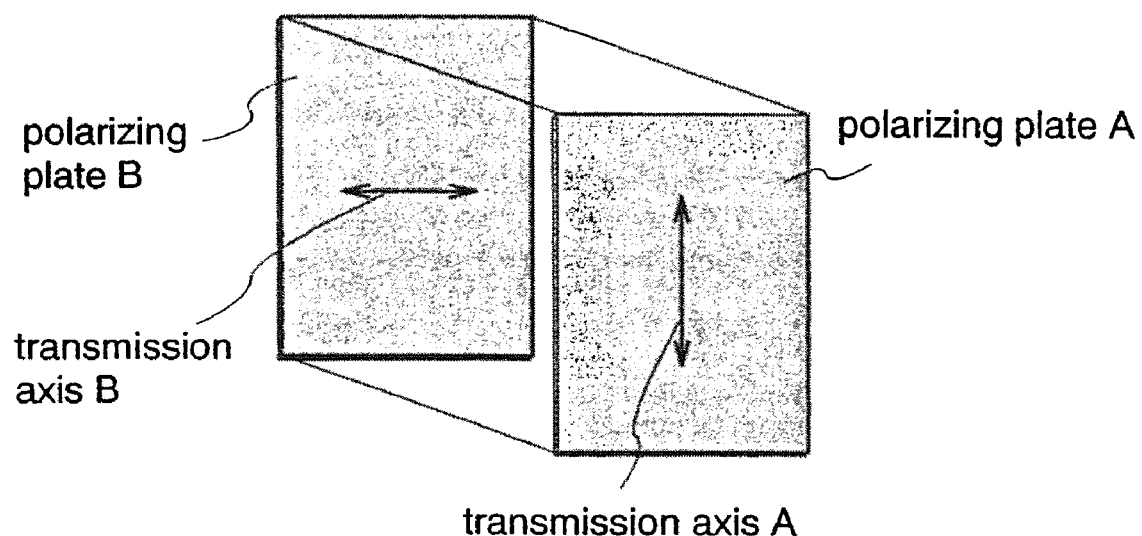
FIG. 17B Definition of Angular Deviation
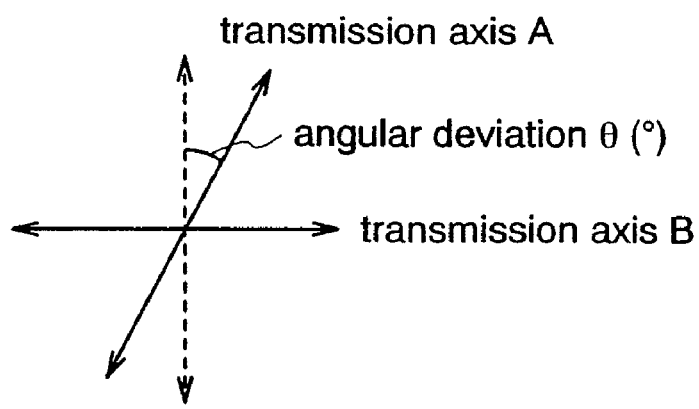

LIGHT-EMITTING DEVICE AND ELECTRONIC DEVICES

CROSS-REFERENCE TO RELATED APPLICATIONS

This application is a continuation of U.S. application Ser. No. 11/001,024, filed Dec. 2, 2004, now allowed, which claims the benefit of a foreign priority application filed in Japan as Serial No. 2003-417382 on Dec. 15, 2003, both of which are incorporated by reference.

BACKGROUND OF THE INVENTION

1. Field of the Invention

The present invention relates to a light-emitting device using a light-emitting element that can produce fluorescence or phosphorescence by applying an electric field to the element provided with a film containing organic compound (hereinafter, also referred to as an organic compound layer) between a pair of electrodes and a manufacturing method thereof. Specifically, the invention relates to a light-emitting device in which light-emitting elements are arranged in active matrix form, and light generated in the light-emitting element is emitted to opposite sides.

2. Description of the Related Art

In recent years, research relating to a light-emitting device having an EL (electroluminescent) element as a self-luminous type light-emitting element has been advanced actively. The light-emitting device is referred to as an organic EL display or an organic light-emitting diode. Since these light-emitting devices have characteristics such as a fast response suitable for movie display, low voltage, and low power consumption driving, they attract an attention as a next generation display including new generation's cellular phones and personal digital assistants (PDA).

An EL element has an organic compound layer (also, referred to as an EL layer), an anode and a cathode. It is known that luminescence by an organic compound includes luminescence generated in returning to a ground state from a singlet excited state (fluorescence) and luminescence generated in returning to a ground state from a triplet excited state (phosphorescence).

One feature of an organic EL panel having an organic EL element is that it does not have a problem of viewing angle because the organic EL panel is a self-luminous type unlike a liquid crystal display device that requires a back light. Namely, an organic EL panel is more suitable for use out of doors than a liquid crystal display, and a variety of usages have been proposed therefor.

A polarizing plate or a circularly polarizing plate is used for a conventional organic EL panel having an organic EL element (for example, Reference 1: Japanese Patent No. 2761453). This is because external light is reflected on an electrode formed in a display portion and thus, the visibility of an image is reduced. In particular, in a state where no image is displayed, an electrode serves as a mirror surface, and the background could be reflected in the electrode. Further, even in a state where an image is displayed, problems such as reduction in contrast or difficulties in displaying black color are caused.

Laminated wave plates such as a laminate of films giving rise to a phase difference of a half wavelength for a monochrome color, which collectively serves as a half wave plate and a laminate of films giving rise to a phase difference of a quarter wavelength, which collectively serves as a quarter wave plate, and a circularly polarizing plate including such a laminated wave plate are generally used (Reference 2: Japanese Patent No. 3174367).

SUMMARY OF THE INVENTION

As an example of an electronic device having an EL element in a display portion, a cellular phone can be given. A cellular phone of late years can conduct displays in a main screen and a sub screen by providing a panel having an EL element and a panel having a liquid crystal device which are overlapped, or by providing panels having a liquid crystal device which are overlapped in response to the increasing information and functions.

However, in the case where a main screen and a sub screen are displayed by providing such a plurality of overlapped panels as described above, an electronic device becomes heavy and thick. In addition, driver circuits or FPCs for two panels, that is, the main screen and the sub screen, are required, and the number of components is increased; therefore, a structure of the electronic device is more complicated.

It is an object of the present invention to provide a light-emitting device having a new structure, which has a plurality of display screens and which further achieves lightweight and thinning. Then, problems of a light-emitting device having such a new structure can be solved.

In view of the above problems, a light-emitting device that can conduct a double-side display, that is, a display on a front side and a display on a rear side with one panel having a light-emitting element (hereinafter, also referred to as a dual emission type display device) is provided. In the dual emission type display device, light from one light-emitting element can be recognized on the side where a semiconductor element is provided (a rear side) and the opposite side thereto (a front side). Accordingly, the thickness of an electronic device having a plurality of display screens can be thinner and reduction in weight and the number of components can be achieved by incorporating a dual emission type display device.

In the dual emission type display device, two display screens of the double display have the same display size and high-definition display with the same image quality level is possible. Power consumption for one panel is needed even though an image is displayed in two display screens. Further, in the dual emission type display device, a common video signal is used, and thus the same image is displayed in the two display screens, although the displayed images are each a mirror reversed image.

The dual emission type display device is technically different from a conventional cellular phone in which double-side displays are conducted with two panels (a panel having a liquid crystal element or a panel having an EL element). In the case of simply including two panels each having an EL element, a manufacturing cost and a mounting cost for two panels are high, video signals for two panels must be prepared, and further power consumption for two panels is necessary. In a conventional cellular phone, a main screen and a sub screen are provided individually, and the sub screen is smaller in size than the main screen and it displays simple characters or simple images only.

In the dual emission type display device, light to be transmitted through a cathode and an anode passes through various layers or substrates. For example, in the case of an active matrix type light-emitting device, the number of laminated layers through which the light passes from a luminous point are different, because an interlayer insulating film (a silicon nitride film or an organic resin film) of a TFT or the like is formed on a cathode side or an anode side so that a switching device such as a TFT is disposed on the cathode side or the anode side. When a sealing substrate is attached, an optical distance is different, that is, a distance from a luminous point to an element substrate is different from a distance from a luminous point to the surface of the sealing substrate.

In the case of dual-emission, in some cases, a difference is generated in optical characteristics (such as color tone) in light-emission from a top face and a bottom face due to an interference effect by a difference of the above optical distance or a difference of transmittances of a cathode material and an anode material. In the case where the anode and the cathode are each formed from materials having different transmittances, and a full-color light-emitting display device is manufactured by using three light-emitting elements (EL elements) of red(R), green(G) and blue(B), there is a problem that color coordinates from the top face and the bottom face are greatly different. When the color coordinates of the top face and the bottom face are different, it is impossible to conduct the same gray-scale display in the top face and the bottom face.

The invention has been made by finding out that color tones can be the same in light-emission from a top face and a bottom face by selecting materials for forming three light-emitting elements (R, G, B) and adjusting the thickness thereof in the dual emission type display device. As for the dual emission type display device, both electrodes of a light-emitting element (an anode and a cathode of a light-emitting element) are required to be highly light-transmitting at the same level. In consequence, the problem of external light reflection on an electrode can be reduced; however, another problem of difficulties in displaying black color (black display) is caused. The problem is caused since the both electrodes (the anode and the cathode of the light-emitting element) are light-transmitting and in the case of black display, in OFF state where no image is displayed, the other side can be seen therethrough. In the case where a light source exists on the rear side, the contrast is reduced in accordance with the difficulties in displaying black color due to the transmitted light.

As thusly described, new other problems in a dual emission type display device have been caused. Hence, an object of the invention is to provide a full-color dual-emission display device in which color tones of light-emission to a top side and a bottom side are almost the same. Further, it is another object of the invention to provide a dual emission type display device which can perform a pure black display and can achieve high contrast.

One feature of the invention is that a polarizing plate or a circularly polarizing plate is provided for a face from which light is emitted in a dual emission type display device. In addition, color tones can be almost the same in light-emission from a top face and a bottom face by selecting materials for making up a dual emission type display device and adjusting the thickness thereof in the dual emission type display device, according to one aspect of the invention. Note that the optical length is different depending on each wavelength, and thus, materials of organic compound containing layers for R, G, and B are selected and the thickness thereof are adjusted in the case of a full-color display. According to the invention, a problem of unevenness in color tones of displays on opposite sides in a new structure of a full-color dual emission type display device can be solved.

A structure of the invention disclosed in this specification is a light-emitting device having a plurality of light-emitting elements each including a cathode, a layer containing organic compound and an anode, comprises a light-emitting group including a light-emitting element that emits red light, a light-emitting element that emits green light and a light-emitting element that emits blue light, that each emit light by an inputted signal; a first polarizing plate arranged on a front side of the light-emitting group; and a second polarizing plate arranged on a rear side of the light-emitting group, wherein the anodes and the cathodes of the light-emitting elements each are a light-transmitting conductive film.

A transmission axis of a polarizing plate and an absorption axis that is at an angle of 90° to the transmission axis (hereinafter, a transmission axis or an absorption axis is referred to as an optical axis) are at 90° to each other in two transmission axes (or absorption axes). Further, transmission axes or absorption axes of polarizing plates may have angular deviations (hereinafter, angular deviation of transmission axes and absorption axes is also referred to as angular deviation of optical axes). The acceptable angular deviation is an angle of ±45° or less (a range of −45° to +45°), preferably, ±30° or less (a range of −30° to +30°), and further preferably, ±10° or less (a range of −10° to +10°), and still further preferably, ±5° or less (a range of −5° to +5°). Black display that is a state of no light-emission can be purely performed and the contrast can be improved by using such polarizing plates.

Further, a wave plate (a quarter wave plate) may be combined with a polarizing plate. Another structure of the invention is a light-emitting device having a plurality of light-emitting elements each including a cathode, a layer containing organic compound and an anode, comprises a light-emitting group including a light-emitting element that emits red light, a light-emitting element that emits green light and a light-emitting element that emits blue light, that each emit light by an inputted signal; a first polarizing plate arranged on a front side of the light-emitting group; a first quarter-wave plate arranged between the light-emitting group and the first polarizing plate; a second polarizing plate arranged on a rear side of the light-emitting group; and a second quarter-wave plate arranged between the light-emitting group and the second polarizing plate, wherein the anodes and the cathodes of the light-emitting elements each are a light-transmitting conductive film.

According to the invention, observers on the front side and the rear side of a panel can see a display thereof. However, in this specification, the transmission axis of a polarizing plate on any one side thereof is 0° and angles of a fast axis or a slow axis of a wave plate and a transmission axis of the other polarizing plate are determined in response to it. Therefore, when a transmission axis of a first polarizing plate is 0° on one observer's side, a first wave plate, a panel, a second wave plate and a second polarizing plate are sequentially determined to be arranged.

A wave plate (a half wave plate) may be combined for a wider band of phase characteristics in a range of visible light. Another structure of the invention is a light-emitting device having a plurality of light-emitting elements each including a cathode, a layer containing organic compound and an anode, comprises a light-emitting group including a light-emitting element that emits red light, a light-emitting element that emits green light and a light-emitting element that emits blue light, that each emit light by an inputted signal; a first polarizing plate arranged on a front side of the light-emitting group; a first quarter-wave plate arranged between the light-emitting group and the first polarizing plate; a first half-wave plate arranged between the first polarizing plate and the first quarter-wave plate; a second polarizing plate arranged on a rear side of the light-emitting group; and a second quarter-wave plate arranged between the light-emitting group and the second polarizing plate; and a second half-wave plate arranged between the second polarizing plate and the second quarter-wave plate, wherein the anodes and the cathodes of the light-emitting elements each are a light-transmitting conductive film.

In the above-described structure, the light-transmitting conductive film is an ITO (indium tin oxide alloy), indium zinc oxide alloy ($In_2O_3$—ZnO), zinc oxide (ZnO), or indium tin oxide including SiOx (ITSO). In the above-described structure, in the case where material of the anode and the cathode are different, the thickness thereof may be adjusted appropriately to obtain the same color tones. Meanwhile, the material of the anode and the cathode are the same, it is preferable that each thickness thereof is equal.

Further, a polarizing plate or a circularly polarizing plate may be provided with an anti-reflective film. For example, an anti-glare treatment can be performed by diffusing reflected light in the depression/projection of the surface, thereby reducing reflection. Alternatively, an anti-reflection treatment may be performed on a polarizing plate or a circularly polarizing plate by a heat-treatment. Thereafter, a hard coat treatment may preferably be also performed for the protection from external shock.

According to the above described structures, the light-emitting device is an electronic device typified by a personal digital assistant, a video camera, a digital camera, a digital video camera or a personal computer. Further, according to the above described structures, the light-emitting device is an electronic device typified by a video-audio bi-directional device or an all-purpose remote-control device.

In the above described structures, the light-emitting device can be seen from an internal side or an external side by being provided for a part of wall or a part of a door. The light-emitting device can be a window that conduct a see-through image display by being provided for a part of wall or a part of a door. According to the invention, a thin and light dual emission type display device can be realized, and thus it is possible to provide such a light-emitting display device in a portion for a windowpane.

Note that, specifically, a circularly polarizing plate denotes a circularly polarizing plate (including an elliptically polarizing plate) including a combination of a wave plate (film) that has phase difference characteristics of $\lambda/4$ or $\lambda/4+\lambda/2$, and a polarizing plate (film) or a linear polarizing film. A broad band quarter-wave plate herein gives a certain phase difference (90 degrees) in the range of visible light.

Specifically, a circularly polarizing plate is one in which an angle between a transmission axis of a polarizing plate and a slow axis of a wave plate (a retardation film) is 45°. Note that a circularly polarizing plate in this specification includes a circularly polarizing film.

When a circularly polarizing plate is arranged in a conventional top emission type panel or a bottom emission type panel, light entering from outside becomes linearly polarized light when it passes through a polarizing plate; the linearly polarized light becomes circularly polarized light by a wave plate; and this circularly polarized light reflects off a metal electrode (cathode or anode); and it becomes linearly polarized light by the wave plate. An angle between the linearly polarized light and the transmission axis of the polarizing plate is 90°, and thus, the reflected light is absorbed into the polarizing plate.

Next, the angular deviation in this specification will be described with reference to FIGS. 17A and 17B. As shown in FIG. 17A, for example, as for transmission axes of polarizing plates, a state where a transmission axis A of a polarizing plate A and a transmission axis B of a polarizing plate B which are at an angle of 90° is called crossed nicols. Further, a state where an absorption axis of the polarizing plate A and an absorption axis of the polarizing plate B which are at 90° is also called crossed nicols.

Moreover, a state where the transmission axis A and the transmission axis B which are parallel to each other is called parallel nicols. Further, a state where the absorption axis of the polarizing plate A and the absorption axis of the polarizing plate B which are parallel to each other is also called parallel nicols.

As shown in FIG. 17B, the angular deviation denotes e.g. a deviation from the 90° angle of the crossed nicols, and a deviation from the parallel nicols where the transmission axis A and transmission axis B are parallel (0°) to each other. The same is true in using absorption axes. Further, the angular deviation may take a value of plus or minus according to the direction of deviation (rotating direction).

A light-emitting device in this specification may include an image display device, a light-emitting device, or a light source (including a lighting system). In addition, a module where a connector, for example, a FPC (Flexible Printed Circuit), a TAB (Tape Automated Bonding) tape, or a TCP (Tape Carrier Package) is attached to the light-emitting device, a module where a printed wiring board is provided at an end of a TAB tape and a TCP, and a module where an IC (integrated circuit) is mounted directly in the light-emitting device by a COG (Chip On Glass) method are all included in the light-emitting device.

In the light-emitting device according to the invention, the driving method for screen display is not especially limited. For example, a dot-sequential driving method, a line-sequential driving method, or a plane-sequential driving method may be used. Typically, the line-sequential driving method is used, and a time-division gray scale driving method or an area gray scale driving method may be used appropriately. In addition, a video signal to be inputted to a source line of the light-emitting device may be an analog signal or a digital signal. A driving circuit or the like may be appropriately designed in accordance with the video signal.

There are a constant voltage (CV) video signal and a constant current (CC) video signal as a video signal inputted to a pixel in a light-emitting device in which a video signal is digital. The constant voltage (CV) video signal includes a signal in which voltage applied to a light-emitting element is constant (CVCV) and a signal in which current applied to a light-emitting element is constant (CVCC). In addition, the constant current (CC) video signal includes a signal in which voltage applied to a light-emitting element is constant (CCCV) and a signal in which current applied to a light-emitting element is constant (CCCC).

In a light-emitting device according to the invention, a protection circuit (such as a protection diode) may be provided for prevention of damages from electrostatic discharge.

The invention is applicable to any TFT structure. For example, the invention can be applied to a top gate TFT, a bottom gate (inversely staggered) TFT, or a staggered TFT. A multi-gate TFT having plural channel forming regions, e.g., a double gate TFT, may be employed without limiting to a single gate structure TFT.

A TFT connected electrically to a light-emitting element may be a p-channel TFT or an n-channel TFT. In the case where it is connected to a p-channel TFT, it is connected to an anode, a hole injecting layer/a hole transporting layer/a light-emitting layer/an electron transporting layer are laminated sequentially on the anode, and then a cathode may be formed thereon. Meanwhile, in the case where it is connected to an n-channel TFT, it is connected to a cathode, an electron transporting layer/a light-emitting layer/a hole transporting layer/a hole injecting layer are laminated sequentially on the cathode, and then an anode may be formed thereon.

An amorphous semiconductor film, a semiconductor film including a crystal structure, a compound semiconductor film including an amorphous structure and the like can appropriately be used as an active layer of the TFT. Further, the active layer of the TFT can be also made of a semi-amorphous semiconductor film (also referred to as a microcrystal semiconductor film) which is a semiconductor having an intermediate structure of an amorphous structure and a crystal structure (including single crystal and polycrystal) and a third state which is stable in terms of free energy, and which includes a crystalline region having a short-range order and lattice distortion.

The semi-amorphous semiconductor film includes a crystal grain of from 0.5 nm to 20 nm in at least a certain region thereof, and the Raman spectrum shifts to the lower side of wave number of 520 $cm^{-1}$. In addition, a diffraction peak of (111) and (220) derived from a Si crystal lattice is observed in the semi-amorphous semiconductor film by X-ray diffraction. The semi-amorphous semiconductor film contains hydrogen or halogen of at least 1 atom % as a neutralizer of a dangling bond. The semi-amorphous semiconductor film is manufactured by performing glow discharging decomposition (plasma CVD) of a silicide gas. As the silicide gas, $Si_2H_6$, $SiH_2Cl_2$, $SiHCl_3$, $SiCl_4$, $SiF_4$, or the like can be used as well as $SiH_4$. The silicide gas may be diluted with $H_2$, or $H_2$ and one or more of rare gas elements: He, Ar, Kr, and Ne. The dilution ratio is within the range of from 2 to 1000 times. Pressure is roughly within the range of from 0.1 Pa to 133 Pa; power frequency, from 1 MHz to 120 MHz, preferably from 13 MHz to 60 MHz; and substrate heating temperature, 300° C. or lower, preferably from 100° C. to 250° C. An atmospheric constitution impurity such as oxygen, nitrogen, or carbon as an impurity element within a film is preferably $1 \times 10^{20}$ $cm^{-1}$ or less, in particular, oxygen concentration is $5 \times 10^{19}/cm^3$ or less, preferably, $1 \times 10^{19}/cm^3$ or less. Note that the field-effect mobility μ of a TFT using a semi-amorphous semiconductor film as an active layer is from 5 $cm^2$/Vsec to 50 $cm^2$/Vsec.

According to the invention, light-emission from one light-emitting element can be seen on a side where a semiconductor element is formed and the opposite side thereto. Accordingly, a much thinner and lighter electronic device including a dual emission type display device can be realized.

The invention can solve a problem of difficulties in displaying in black in a dual emission type display device, and enhance contrast by displaying in black more favorably by using a polarizing plate or a circularly polarizing plate.

Additionally, a full-color display in which color tones of the two display screens are the same can be obtained in a dual emission type display device.

These and other objects, features and advantages of the present invention become more apparent upon reading of the following detailed description along with the accompanying drawings.

BRIEF DESCRIPTION OF THE DRAWINGS

In the accompanying drawings:

FIGS. 14A to 14E each show an electronic device including a dual emission type display device according to one aspect of the invention;

FIGS. 17A and 17B each show a definition of an angular deviation.

DETAILED DESCRIPTION OF THE INVENTION

Figure 1:
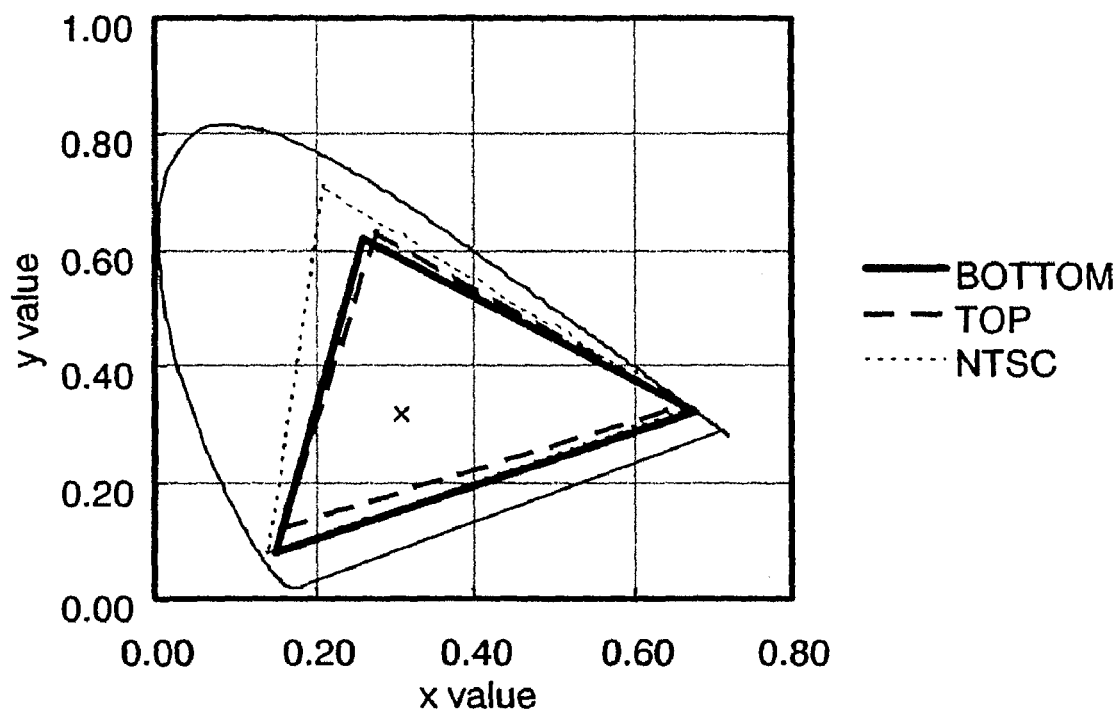
FIG. 1 is a graph showing a comparison of color coordinates.

Embodiment Modes of the invention are described hereinafter.

Embodiment Mode 1

A method for manufacturing a dual emission type display device is described with reference to FIG. 2.

A base insulating film is formed over a substrate 400 first. In the case of extracting light by using a substrate side as one display surface, a light-transmitting glass substrate or quartz substrate may be used as the substrate 400. In addition, a light-transmitting plastic substrate that is heat-resistant enough to withstand a processing temperature may be used. Herein, a glass substrate is used as the substrate 400. Note that a refractive index of the glass substrate is approximately 1.55.

A base film made of an insulating film such as a silicon oxide film, a silicon nitride film, or a silicon oxynitride film is formed as the base insulating film. Note that the base insulating film is also light-transmitting. Although the base film has a two-layer structure here, it may have a single layer structure or a laminated structure of two or more layers of the above insulating films. Note that the base insulating film is not formed necessarily.

Next, a semiconductor layer is formed over the base insulating film. The semiconductor layer is formed by forming a semiconductor film having an amorphous structure by a known method (sputtering, LPCVD, plasma CVD, or the like), and thereafter, patterning a crystalline semiconductor film obtained by a known crystallization treatment (laser crystallization, thermal crystallization, thermal crystallization using a catalyst such as nickel, or the like) by using a first photomask to have a desired shape. The semiconductor layer is formed to have a thickness of from 25 nm to 80 nm (preferably, from 30 nm to 70 nm). There is no particular limitation on a material of the crystalline semiconductor film; however, the crystalline semiconductor film may preferably be made of silicon, a silicon-germanium (SiGe) alloy, or the like.

In addition, a continuous wave laser may be used for the crystallization treatment of a semiconductor film having an amorphous structure. In the case of crystallizing an amorphous semiconductor film, it is preferable to apply a second harmonic to a fourth harmonic of a fundamental wave using a solid laser which can continuously oscillate in order to obtain a crystal with a large grain size. Typically, a second harmonic (532 nm) or a third harmonic (355 nm) of an Nd:$YVO_4$ laser (a fundamental wave of 1064 nm) may be applied. In the case of using the continuous wave laser, laser light emitted from a continuous wave $YVO_4$ laser having output of 10 W is converted to a harmonic by a nonlinear optical element. There is also a method for emitting a harmonic by putting a $YVO_4$ crystal and the nonlinear optical element in a resonator. Then, the harmonic is preferably shaped into rectangular or elliptical laser light on an irradiated surface by an optical system and an object to be treated is irradiated therewith. At this time, the energy density of approximately from 0.01 $MW/cm^2$ to 100 $MW/cm^2$ (preferably, from 0.1 $MW/cm^2$ to 10 $MW/cm^2$) is required. The semiconductor film may be irradiated by being moved relatively to the laser light at the speed of approximately from 10 cm/s to 2000 cm/s.

Subsequently, a gate insulating film covering the semiconductor layer is formed after the resist mask is removed. The gate insulating film is formed by a plasma CVD method, a sputtering method or a thermal oxidation method to have a thickness of from 1 nm to 200 nm. An insulating film such as a silicon oxide film, a silicon nitride film or a silicon oxynitride film is formed as the gate insulating film. Note that the gate insulating film is also light-transmitting. When plasma CVD is used for forming such a thin gate insulating film, it is necessary to obtain a thin film thickness with good controllability by slowing down a formation rate. For example, film formation speed of the silicon oxide film can be set to 6 inn/min when RF power is set at 100 W, 10 kHz; pressure, 0.3 Torr; an $N_2O$ gas flow, 400 scam; and a $SiH_4$ gas flow, 1 scam.

Next, a conductive film is formed over the gate insulating film to have a thickness of 100 nm to 600 nm. Here, a conductive film having a laminated structure of a TaN film and a W film is formed by a sputtering method. The laminate of the TaN film and the W film is given here as the conductive film, but the conductive film is not limited thereto. As for the conductive film, a single layer of one element of Ta, W, Ti, Mo, Al, and Cu, an alloy material or a compound material containing the element as its main component, or a laminate thereof can be used. A semiconductor film typified by a polycrystalline silicon film doped with an impurity element such as phosphorous may be also used.

Subsequently, a resist mask is formed by using a second photomask, and etching is performed by a dry etching method or a wet etching method. In this etching step, the conductive film is etched to form gate electrodes of TFTs 402R, 402G and 402B.

Next, a resist mask is newly formed by using a third photomask after removing the resist mask. A first doping step for doping an impurity element which imparts n-type to a semiconductor (typically, phosphorus or As) at low concentration is performed to form an n-channel TFT not shown herein. The resist mask covers a region to be a p-channel TFT and a vicinity of the conductive layer. A low concentration impurity region is formed by performing through-doping through the insulating film by the rust doping step. A plurality of TFTs is used to drive one light-emitting element. However, the above-mentioned doping step is not conducted necessarily when the light-emitting element is driven by only a p-channel TFT.

Then, a resist mask is newly formed by using a fourth photomask after removing the resist mask. A second doping step is performed to dope an impurity element which imparts p-type to a semiconductor (typically, boron) at high concentration. A p-type high concentration impurity region is formed by performing through-doping through the insulating film by the second doping step.

Then, a resist mask is newly formed by using a fifth photomask. A third doping step for doping an impurity element which imparts n-type to a semiconductor (typically, phosphorus or As) at high concentration is performed to form an n-channel TFT not shown herein. The resist mask covers the region to be the p-channel TFT and a vicinity of the conductive layer. Through-doping is performed through the gate insulating film by the third doping step to form an n-type high concentration impurity region.

Afterwards, activation and hydrogenation of the impurity element added to the semiconductor layer are performed after removing the resist mask and forming an insulating film containing hydrogen. The insulating film containing hydrogen is made of a silicon nitride oxide film (SiNO film) obtained by a PCVD method. In addition, gettering for reducing nickel in a channel formation region can also be performed at the same time as activation, when the semiconductor film is crystallized by using a metal element which promotes crystallization, typically, nickel. Note that the insulating film containing hydrogen is a first layer of an interlayer insulating film and a light-transmitting insulating film containing silicon oxide.

Then, a planarizing film to be a second layer of the interlayer insulating film is formed. A light-transmitting inorganic material (silicon oxide, silicon nitride, silicon oxynitride, or the like), a photosensitive or non-photosensitive organic material (polyimide, acrylic, polyamide, polyimideamide, benzocyclobutene or a resist), a laminate of these materials, or the like is used for the planarizing film. Further, an insulating film formed of an SiOx film including an alkyl group to be obtained by an application method, e.g., an insulating film made of silica glass, alkyl siloxane polymer, alkyl silsesquioxane polymer, hydrogenated silsesquioxane polymer, hydrogenated alkyl silsesquioxane polymer or the like, can be used as another light-transmitting film used for the polarizing film. There is given PSB-K1 or PSB-K31 of an insulating coating film material made by Toray Industries. or ZRS-5PH of an insulating coating film material made by Catalysts & Chemicals Industries. as an example of the siloxane based polymer.

Then, a third light-transmitting interlayer insulating film is formed. The third interlayer insulating film is provided as an etching stopper film in patterning a transparent electrode 403 to be formed in a later step so as to protect the planarizing film which is the second interlayer insulating film. Note that the third interlayer insulating film is not needed when the second interlayer insulating film can serve as an etching stopper film in patterning the transparent electrode 403.

A contact hole is formed in the interlayer insulating film by using a sixth mask. Then, the sixth mask is removed. After a conductive film (TiN/Al/TiN) is formed, it is etched (dry-etched with a mixture gas of BCl 3 and Cl 2) using an eighth mask to form a wiring (such as a source wiring or a drain wiring of a TFT or a current supply wiring). Note that TiN is one of materials that have a favorable adhesiveness with a highly thermostable planarizing film. In addition, it is preferable that an N content of TiN is less than 44% so as to have a contact with a source region or a drain region of the TFT.

The transparent electrode 403, that is, an anode of an organic light-emitting element is formed to be 10 nm to 800 nm thick using a seventh mask. A transparent conductive material having a high work function (work function of 4.0 eV or higher) such as indium tin oxide including Si element (ITSO), or indium zinc oxide (IZO) in which zinc oxide (ZnO) of 2 to 20% is mixed into indium oxide can be used for the transparent electrode 403, as well as indium tin oxide (ITO).

An insulator (also referred to as a bank, a partition wall, a barrier, an embankment and the like) covering an edge of the transparent electrode 403 is formed using the eighth mask. The insulator can be made of a photosensitive or non-photosensitive organic material (polyimide, acrylic, polyamide, polyimideamide, benzocyclobutene or a resist) or an SOG film obtained by an application method (for example, a SiOx film including an alkyl group) to be 0.8 μm to 1 μm thick.

Next, layers containing organic compound 404, 405R, 405G, 405B, and 406 are formed by an evaporation method or an application method. It is preferable to perform vacuum heating for deaeration before forming the layer containing organic compound 404 in order to improve reliability. For example, it is preferable to perform a heat treatment at a temperature of from 200° C. to 300° C. under a low pressure atmosphere or an inert atmosphere in order to remove a gas included in the substrate, before evaporating an organic compound material. Here, when the interlayer insulating film and the bank are made of a highly thermostable SiOx film, a heat treatment at higher temperature (410° C.) is conducted additionally.

A first layer containing organic compound 404 (a first layer) is formed on the transparent electrode 403 by a co-evaporation of molybdenum oxide (MoOx), 4,4'-bis[N-(1-naphthyl)-N-phenyl-amino]-biphenyl (α-NPD) and rubrene using an evaporation mask.

Note that a material having a favorable hole injecting property such as copper phthalocyanine (CuPC), vanadium oxide (VOx), ruthenium oxide (RuOx), or tungsten oxide (WOx) can be used as well as MoOx. In addition, a film made of a high-molecular weight material (polymer material) having a favorable hole injecting property such as a poly (ethylenedioxythiophen)/poly (styrenesulfonic acid) water solution (PEDOT/PSS) by an application method may be used for the first layer containing organic compound 404.

α-NPD is deposited selectively using an evaporation mask to form a hole transporting layer (second layer) on the first layer containing organic compound 404. A material having a favorable hole transporting property typified by an aromatic amine based compound such as 4,4'-bis[N-(3-methylphenyl)-N-phenylamino]-biphenyl (TPD), 4,4',4"-tris(N,N-diphenyl-amino)-triphenylamine (TDATA), or 4,4',4"-tris[N-(3-methylphenyl)-N-phenyl-amino]triphenylamine (MTDATA) can be used as well as α-NPD.

Light-emitting layers 405R, 405G and 405B (third layers) are formed selectively. The light-emitting layers 405R, 405G and 405B are deposited selectively by aligning evaporation masks for every light-emitting colors (R, G, B) to obtain a full-color display.

For the light-emitting layer 405R for red light-emission, a material such as $Alq_3$:DCM or $Alq_3$:rubrene:BisDCJTM is used. For the light-emitting layer 405G for green light-emission, a material such as $Alq_3$:DMQD (N,N'-dimethyl quinacridone) or $Alq_3$:coumarin 6 is used. For the light-emitting layer 405B for blue light-emission, a material such as α-NPD or t-Bu-DNA is used.

$Alq_3$ (tris(8-quinolinolate) aluminum) is deposited selectively using an evaporation mask to form an electron transporting layer (fourth layer) on the light-emitting layers 405R, 405G and 405B. A material having a favorable electron transporting property typified by metal complexes having a quinoline skeleton or benzoquinoline skeleton such as tris (4-methyl-8-quinolinolate)aluminium ($Almq_3$), bis(10-hydroxybenzo[h]-quinolinato)beryllium ($BeBq_2$), bis(2-methyl-8-quinolinolate)-4-phenyl phenolate-aluminium (BAlq) or the like can be used as well as $Alq_3$. Other examples include metal complexes having oxazole-based and thiazole-based ligands such as bis[2-(2-hydroxyphenyl)-benzoxazorato]zinc ($Zn(BOX)_2$) and bis[2-(2-hydroxyphenyl)-benzothiazorato]zinc ($Zn(BTZ)_2$). Further, 2-(4-biphenylyl)-5-(4-tert-butylphenyl)-1,3,4-oxadiazole (PBD), and 1,3-bis[5-(p-tert-butylphenyl)-1,3,4-oxadiazole-2-yl]benzene (OXD-7); 3-(4-tert-butylphenyl)-4-phenyl-5-(4-biphenylyl)-1,2,4-triazole (TAZ) and 3-(4-tert-butylphenyl)-4-(4-ethylphenyl)-5-(4-biphenylyl)-1,2,4-triazole (p-EtTAZ); bathophenanthroline (BPhen); bathocuproin (BCP) and the like can be used as the electron transporting layer in addition to metal complexes, since they have a favorable electron transporting property.

Next, 4,4'-bis(5-methylbenzoxazol-2-yl)stilbene (BzOS) and lithium (Li) are co-deposited to form an electron injecting layer (fifth layer) 406 entirely to cover the electron transporting layer and the insulator. Damages from sputtering for forming the transparent electrode 407 later can be suppressed by using benzoxazole derivatives (e.g. BzOS). Note that a compound of an alkali metal or an alkali earth metal such as $CaF_2$, lithium fluoride (LiF), cesium fluoride (CsF), or the like, which have a favorable electron injecting property can be used in addition to BzOS:Li. Further, a mixture of $Alq_3$ and magnesium (Mg) can be also used.

The transparent electrode 407, that is a cathode of the organic light-emitting element is formed on the fifth layer 406 to be 10 to 800 nm thick. Indium tin oxide including Si element (ITSO), or indium zinc oxide (IZO) in which zinc oxide (ZnO) of 2 to 20% is mixed into indium oxide can be used for the transparent electrode 407 as well as indium tin oxide (ITO).

As described above, a light-emitting element is manufactured. Materials for an anode, layers containing organic compound (first to fifth layers) and a cathode, which each make up a light-emitting element, are appropriately selected and the each thickness thereof is adjusted. It is preferable that the anode and the cathode are formed from the same material and have almost the same thickness, preferably, a thin thickness of about 100 nm.

If necessary, a transparent protective layer (not shown) for preventing water from entering is formed to cover the light-emitting element. A silicon nitride film, a silicon oxide film or a silicon oxynitride film (an SiNO film (N>O in composition ratio) or an SiON film (N<O in composition)), a thin film mainly containing carbon (such as DLC film or a CN film) or the like, which can be obtained by a sputtering method or a CVD method, can be used.

A second substrate 408 is attached to the substrate 400 by using a sealing agent containing a gap material for keeping a substrate gap. The second substrate 408 may be also formed from a light-transmitting glass substrate or quartz substrate. Note that the gap between the pair of substrates may be provided with a drying agent as an airgap (an inert gas) or be filled with a transparent sealing agent (ultraviolet curing resin, thermosetting epoxy resin or the like).

Figure 2:
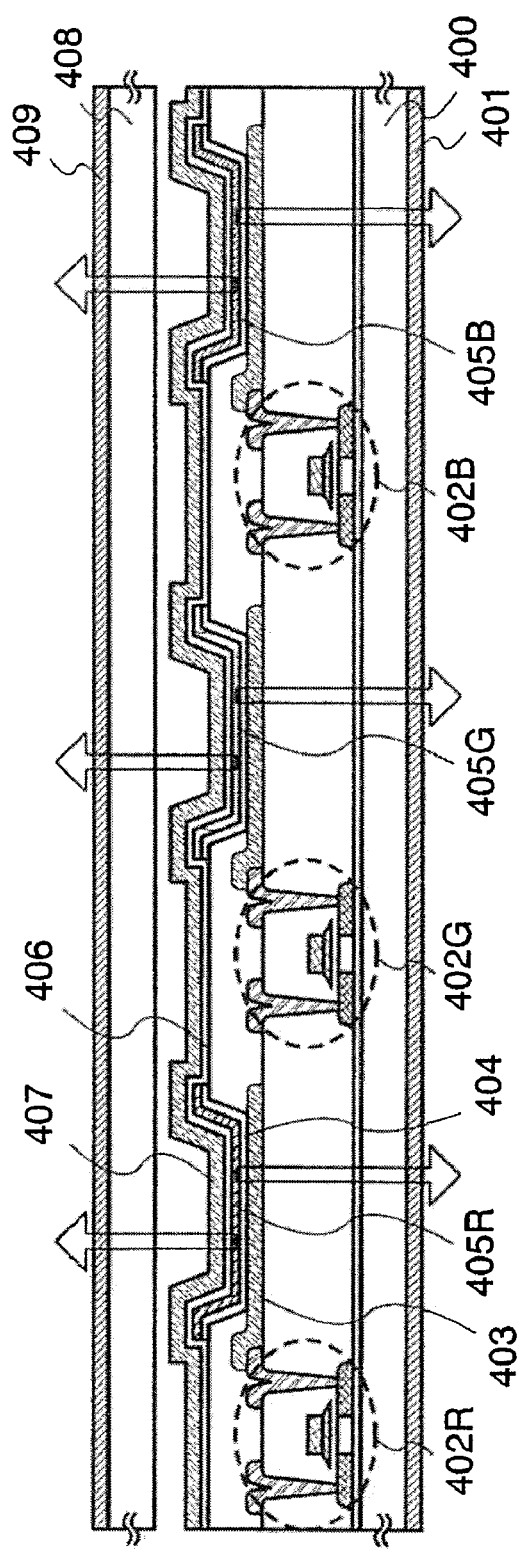
FIG. 2 shows a cross-sectional structure of a panel.

In the light-emitting element, the transparent electrodes 403 and 407 are formed from a light-transmitting material, and light can be extracted in two directions, in other words, towards the opposite sides as shown by the outline arrows of FIG. 2.

By employing a panel structure described above, color coordinates of light-emission from a top face and a rear face can be almost the same as shown in FIG. 1.

Lastly, optical films 401 and 409 (a polarizing plate or a circularly polarizing plate) are provided to enhance contrast.

Figure 3A:
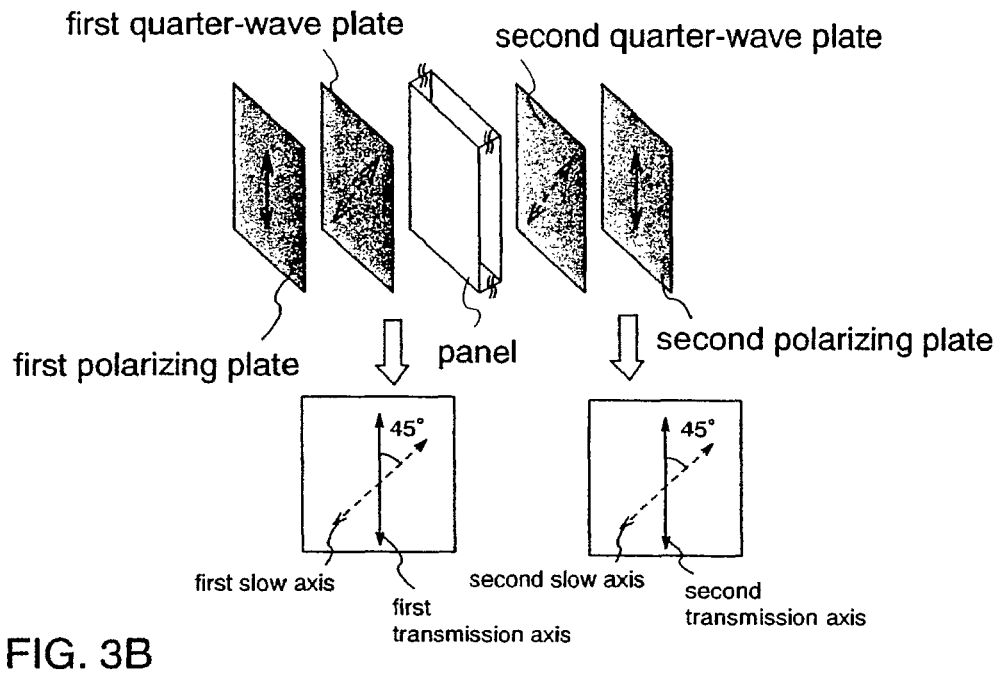
FIGS. 3A and 3B each show an arrangement of a circularly polarizing plate according to one aspect of the invention.
Figure 3B:
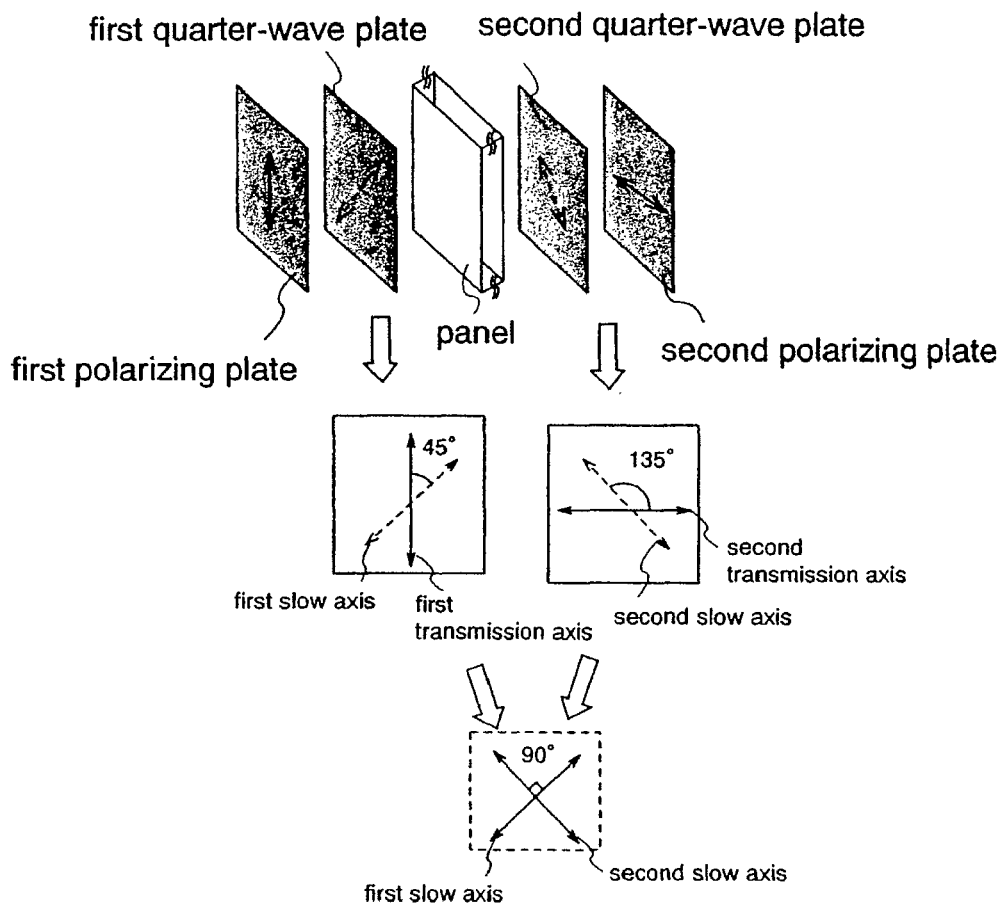

An optical film 401 (a quarter wave plate and a polarizing plate are arranged from the substrate side) for the substrate 400 and an optical film 409 (a quarter wave plate and a polarizing plate are arranged from the second substrate side) for the second substrate 408 are provided respectively. These structures are shown in FIGS. 3A and 3B. In FIG. 3A or 3B, a panel is a light-emitting device in which a light-emitting element is provided between the substrate 400 and the second substrate 408.

Figure 4:
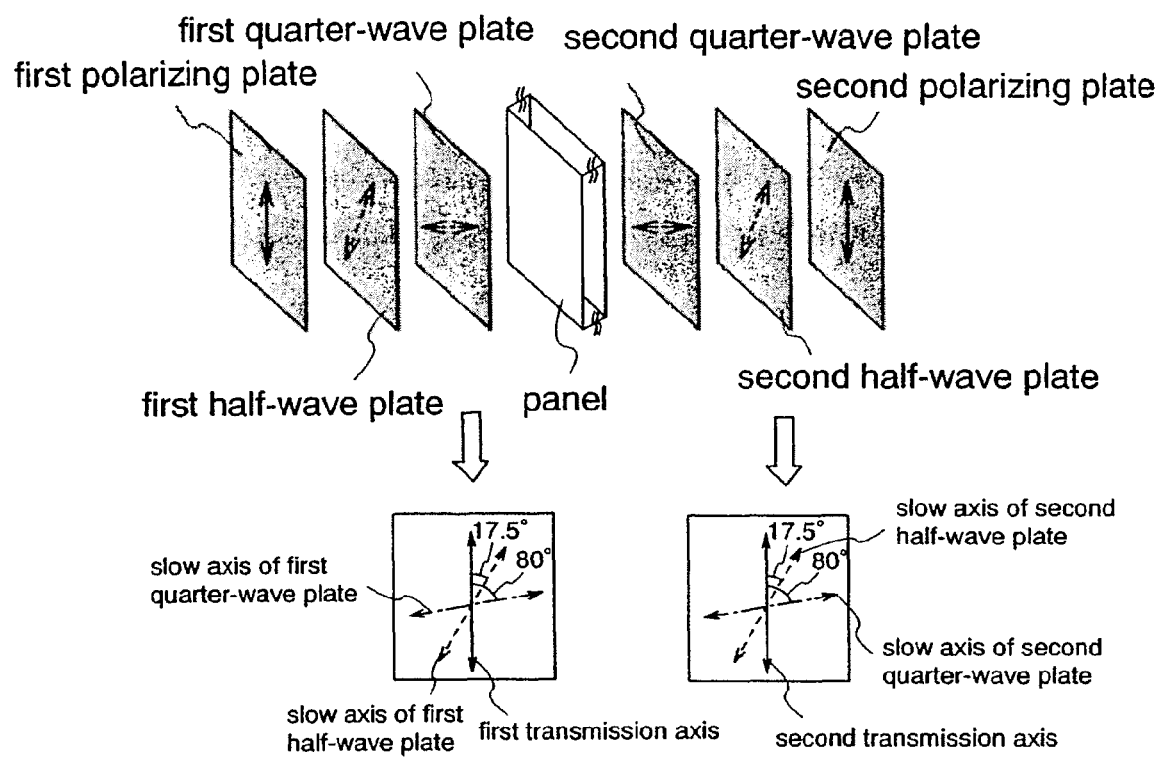
FIG. 4 shows an arrangement of a circularly polarizing plate according to one aspect of the invention.

As another structure, an optical film 401 (a quarter wave plate, a half wave plate and a polarizing plate are arranged from the substrate side) for the substrate 400 and an optical film 409 (a quarter wave plate, a half wave plate and a polarizing plate are arranged from the second substrate side) for the second substrate 408 are provided respectively. This structure is shown in FIG. 4. In FIG. 4, a panel is a light-emitting device in which a light-emitting element is provided between the substrate 400 and the second substrate 408.

Example 1 of Experiment

In this embodiment mode, the transmittance in the case of using a combination of polarizing plates using a metal halide lamp IMH-250 (manufactured by SIGMA KOKI) as a light source is evaluated. Reference of this experiment is air.

The arrangement conditions of polarizing plates are shown below. The arrangement conditions is an order from a light-source. Condition 1: polarizing plate A and polarizing plate B Angular dependency of the polarizing plates A and B arranged as Condition 1 is measured in this embodiment mode. The result is shown below.

Figure 5:
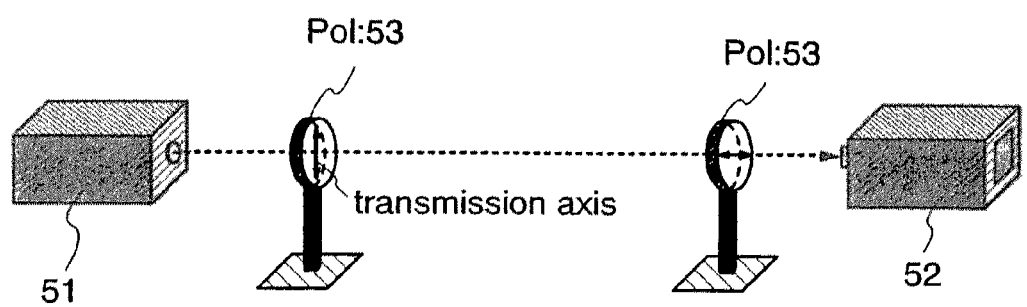
FIG. 5 shows an experiment relating to one aspect of the invention.

First, the polarizing plates A and B are arranged at a 90° angle as crossed nicols and the state is an angular deviation of 0°. Then, the relation between transmitted light and the angular deviation of the optical axis of the polarizing plate A from the crossed nicols in a measurement system in FIG. 5 is shown in Table 1. Further, in Table 1, luminance of the transmitted light is normalized as 1 by the value of parallel nicols (angular deviation: 90°, −90°). The transmission axis is used as the optical axis of the polarizing plate here.

TABLE 1

| Angle | Luminance (normalized) |
|---|---|
| 0 | 0.000668185 |
| 5 | 0.005187927 |
| 10 | 0.025873197 |
| 15 | 0.065451784 |
| 20 | 0.118033409 |
| 25 | 0.183921792 |
| 30 | 0.233295368 |
| 40 | 0.392179195 |
| 45 | 0.47911921 |
| 50 | 0.576689446 |
| 60 | 0.731017464 |
| 70 | 0.871298405 |
| 80 | 0.958807897 |
| 90 | 1 |
| 0 | 0.000662273 |
| −5 | 0.012926457 |
| −10 | 0.040802292 |
| −15 | 0.087277937 |
| −20 | 0.140687679 |

TABLE 1-continued

| Angle | Luminance (normalized) |
|---|---|
| −25 | 0.214708691 |
| −30 | 0.262082139 |
| −35 | 0.344794651 |
| −40 | 0.430563515 |
| −45 | 0.519579752 |
| −50 | 0.601337154 |
| −60 | 0.757402101 |
| −70 | 0.89321872 |
| −80 | 0.977459408 |
| −90 | 1 |

Figure 6:
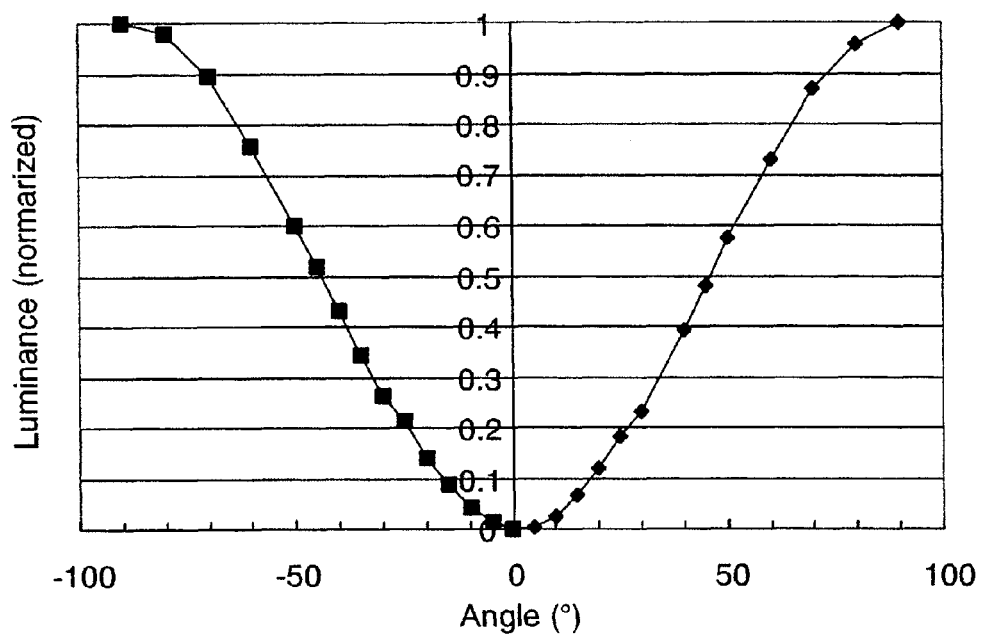
FIG. 6 is a graph showing an experiment result relating to one aspect of the invention.

FIG. 6 shows a graph based on Table 1.

Consequently, an acceptable angular deviation between the polarizing plates A and B is considered ±45° or less where the luminance is reduced by 50%, preferably, ±30° or less where the luminance is reduced by 30%, and further preferably, ±10° or less where the luminance is reduced by 99%, and still further preferably, ±5° or less.

Example 2 of Experiment

Here, an experiment for evaluating reflected light using a polarizing plate or various circularly polarizing plates by using a metal halide lamp IMH-250 (manufactured by SIGMA KOKI) as a light source is performed.

First, Samples made under the conditions shown below are prepared. The number shown in ( ) is an angle formed between a transmission axis (0°) of a polarizing plate and a slow axis of a wave plate.
Condition 1: glass substrate+metal film
Condition 2: glass substrate+metal film+polarizing plate
Condition 3: glass substrate+metal film+quarter-wave plate (45°)+polarizing plate
Condition 4: glass substrate+metal film+quarter-wave plate (80°)+half-wave plate) (17.5°)+polarizing plate
Condition 5: glass substrate+metal film+quarter-wave plate (45°)+half-wave plate) (45°)+polarizing plate
Condition 6: glass substrate+metal film+half-wave plate (45°)+polarizing plate In this experiment, reference of this experiment is air and a metal film, Al—Ti film of 100 nm is formed by a sputtering method.

Figure 7:
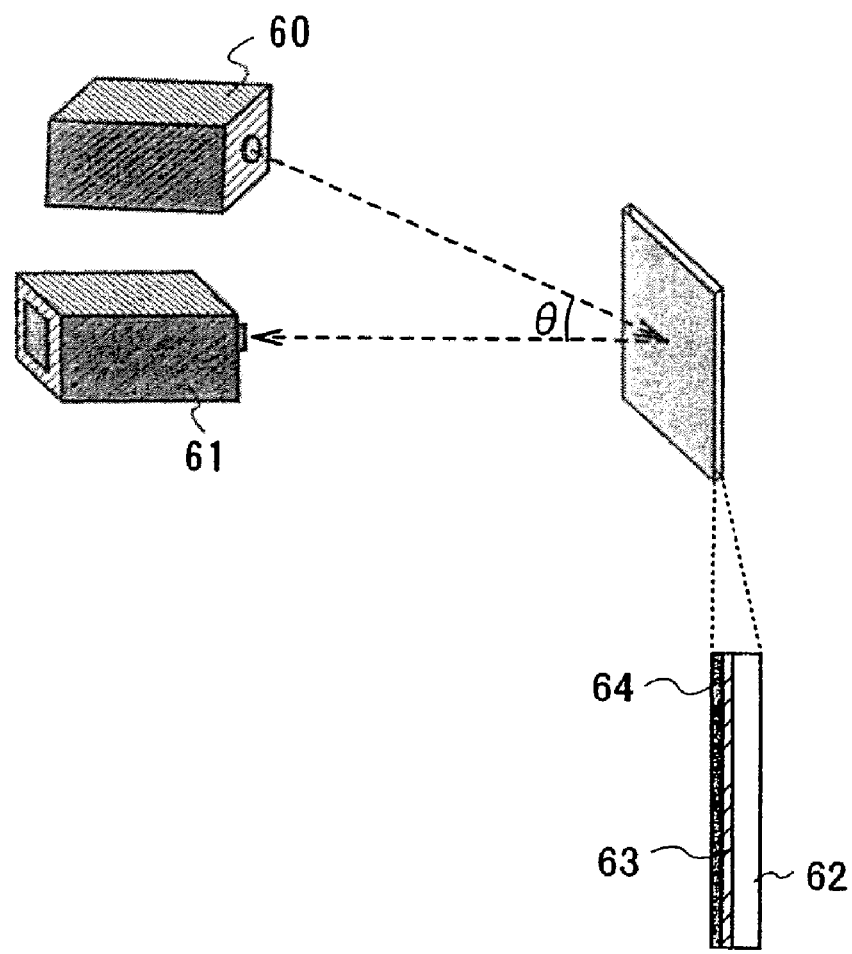
FIG. 7 shows an experiment relating to one aspect of the invention.

A measurement system used for a sample (Condition 3) is shown in FIG. 7. The luminance of reflected light (cd/m$^2$) is measured under the following conditions: a light source 60 enters at an angle of θ=30° to the sample; and a device for measuring reflected light BM-5A (a light receiving device) 61 is arranged perpendicularly to the sample.

Table 2 shows measurement results of the samples (Conditions 1 to 6).

TABLE 2

| Sample | Luminance of Reflected Light |
|---|---|
| ① | 28 |
| ② | 13 |
| ③ | 5.4 |
| ④ | 5 |
| ⑤ | 5.8 |
| ⑥ | 20 |

As evidenced by Table 2, the samples, that is, Conditions 3 to 5 have a favorable effect of preventing reflected light.

The reflected light in the samples of Conditions 1 to 6 is measured in the wave length range of 400 nm to 800 nm by a spectrophotometer U4000 (manufactured by Hitachi, Ltd.). The result is shown in FIG. 8.

Figure 8:
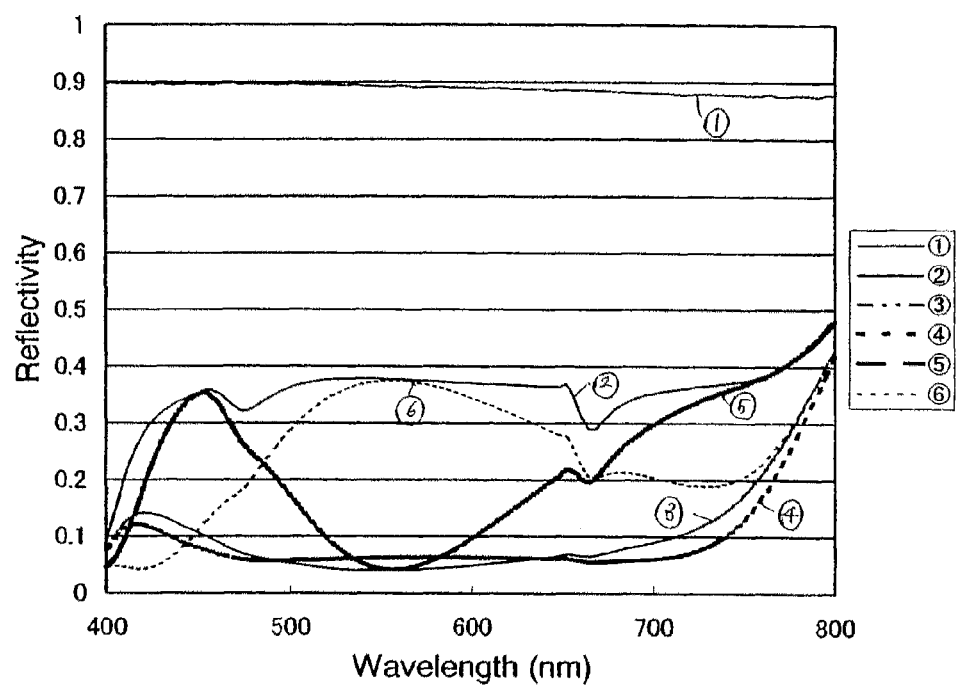
FIG. 8 is a graph showing an experiment result relating to one aspect of the invention.

As is clear from FIG. 8, the samples that can obtain low reflectivity is ones of Conditions 3 to 5. In particular, in the samples of Conditions 3 and 4, preferable low reflectivity can be obtained in a wide range. Further, as compared to Table 2, it is found that the reflected light can be considerably prevented when a polarizing plate or a wave plate is provided.

Embodiment Mode 2

In this embodiment mode, a case where an optical film, typically, a polarizing plate or a circularly polarizing plate, is provided in a dual emission type display device will be described.

Figure 9A:
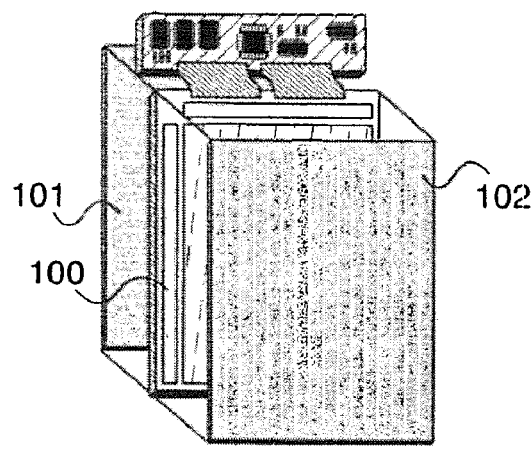
FIGS. 9A to 9D each show a dual emission type display device according to one aspect of the invention.

A general view of a dual emission type display device is shown FIG. 9A. A first polarizing plate 101 is disposed on a panel 100 of the dual emission type display device, and a second polarizing plate 102 is arranged as crossed nicols, that is the optical axes of the first and the second polarizing plates are at 90°.

Hereupon, the optical axes of the polarizing plates may have angular deviation from crossed nicols configuration, and the angular deviation may be ±45° or less, preferably, ±30° or less, and further preferably, ±10° or less, and still further preferably, ±5° or less. When the angular deviation from crossed nicols configuration is ±45° or less, the transmitted light is reduced by 50% as compared with the transmitted light under parallel nicols configuration from the Experiment 1. Further, in the case where the angular deviation is ±10° or less, the transmitted light is reduced by 90% or more, and further in the case where the angular deviation is ±5° or less, the transmitted light is reduced by 99% or more; and these conditions are suitable for practical use.

Figure 9B:
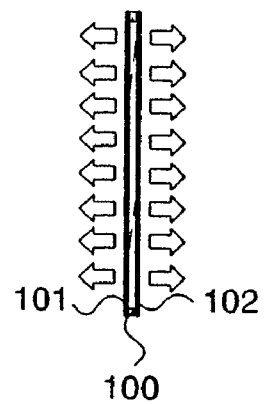

In a panel 100, a display portion 103 which is provided with a light-emitting element or a semiconductor element, and a driver circuit portion are provided; and the driver circuit portion is connected to an external circuit via a flexible printed circuit board (FPC), an anisotropic conductive film (ACF), or the like. The external circuit includes a power supply circuit, a controller or the like. As shown in FIG. 9B, such a dual emission type display device emits light from both surfaces (a first display surface and a second display surface) of the panel having the light-emitting element.

Further in the invention, the color emitted from a light-emitting element may be monochrome, or full color (of RGB toned). For example, a full color display or an area color display can be performed by using a color filter, or a color filter and a color conversion layer when a white light-emitting material is used. Further, a full color display or an area color display can be performed by using a color conversion layer when a blue light-emitting material is used.

Figure 9C:
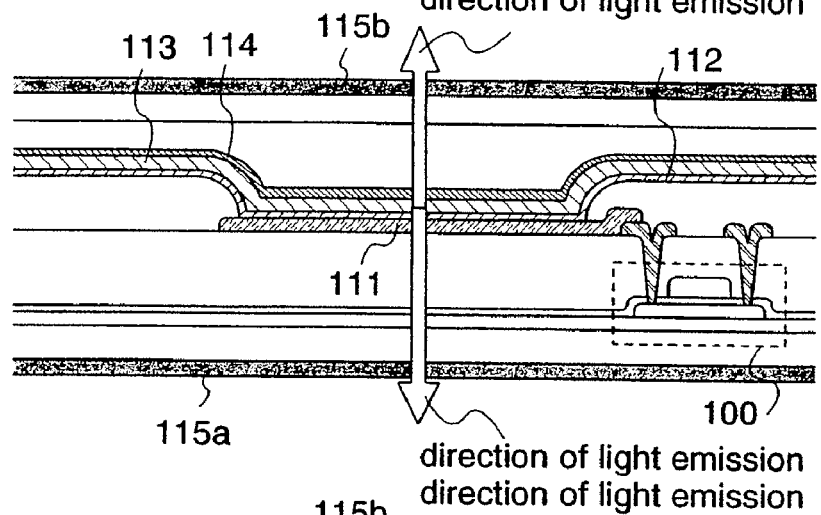

An enlarged cross-sectional view of a panel is shown in FIG. 9C. A driver transistor of this embodiment mode is described by taking the case of using a thin film transistor (TFT) having a polycrystalline silicon film as an example; however, a thin film transistor having an amorphous silicon film, a thin film transistor having a semi-amorphous semiconductor film (also referred to as microcrystalline semiconductor film) or a MOS transistor having a single crystal may also be employed.

Further, the driving TFT here has the polarity (conductivity) of a p-channel type; however, it is natural that the driving TFT may also be an n-channel type.

As shown in FIG. 9C, a driving TFT 100 provided over an insulating surface has an impurity region that is formed by adding an impurity element such as boron to a semiconductor film and that is to be a source and drain region. The semiconductor film is crystallized by laser irradiation, heating or the use of metal such as nickel. A gate electrode is provided over a channel forming region of the semiconductor film with a gate insulating film therebetween. A scanning line (not shown) is provided in the same layout as the gate electrode. A first insulating film is provided so as to cover the gate electrode, and a contact hole is formed in the first insulating film over the impurity region. A wiring formed in the contact hole serves as a source wiring or a drain wiring, and a signal line (not shown) is provided in the same layout. A first electrode 111 is provided so as to be electrically connected to the drain electrode. Further, a second insulating film is provided so as to cover the first electrode 111, and an opening portion is formed over the first electrode. A layer containing organic compound (hereinafter, also referred to as an organic compound layer or an EL layer) 112 is provided in the opening portion, and a second electrode 113 is provided so as to cover the organic compound layer and the second insulating film.

In the organic compound layer 112, an HIL (hole injecting layer), an HTL (hole transporting layer), an EML (light-emitting layer), an ETL (electron transporting layer), and an EIL (electron injecting layer) are stacked in order from the anode side. Typically, CuPc for an HIL, α-NPD for an HTL, BCP for an ETL, and BCP: Li for an EIL are respectively used.

As for the organic compound layer 112, in the case of a full-color display, specifically, a material layer each producing luminescence of red (R), green (G), and blue (B) may be deposited appropriately and selectively by a vapor deposition method with the use of respective deposition masks or by an ink-jetting method. In the above organic compound layers of each color, CuPc and α-NPD that are common for the colors can be formed over the entire surface of the pixel portion. Further, a mask can be shared by the respective colors, for example, a red organic compound layer, a green organic compound layer, and a blue organic compound layer can be formed in order by suitably sliding the same mask. Note that the forming order of the organic compound layers of each color can be decided appropriately.

In the case of white light emission, a full-color display may be performed by separately providing a color filter or a color filter and a color conversion layer. A color filter or a color conversion layer may be provided on the second substrate, and may be attached to the substrate thereafter. Further, a color filter or a color conversion layer for white light that is emitted downward may be formed through an insulating film after a drain wiring (or a source wiring) is formed. Furthermore, a dual emission type display device in which one surface gives a full-color display and the other gives a monochrome display can be obtained.

A passivation film containing nitrogen 114 is formed by a sputtering method or a CVD method, thereby preventing penetration of water and oxygen. The space formed at the time may be filled with nitrogen and sealed, and a drying agent may be also disposed inside the space. Further, the side surfaces of the display portion may be covered with the first electrode, the second electrode, and another electrode. Thereafter, a sealing substrate is attached to the substrate, and a first polarizing plate 115a and a second polarizing plate 115b are provided for the substrate and the sealing substrate respectively.

In the thusly formed dual emission type display device according to the invention, the first electrode 111 and the second electrode 113 are light-transmitting. Accordingly, light is emitted from the light-emitting layer to the first display surface through the first electrode 111, and the light is emitted from the light-emitting layer to the second display surface through the second electrode 113. In other words, luminescence from the light-emitting element is emitted toward both the substrate side where a driving TFT is provided and the sealing substrate side opposed to the substrate side (see the arrows showing the direction of the light emission in the figure).

In addition, the dual emission type display device emits light and black display is performed in the part except the displaying area by disposing the first and the second polarizing plate as crossed nicols, so that the background cannot be seen through even when viewing from either side. Pure black display is possible and contrast can be improved by using polarizing plates for a dual emission type display device according to the invention.

Figure 9D:
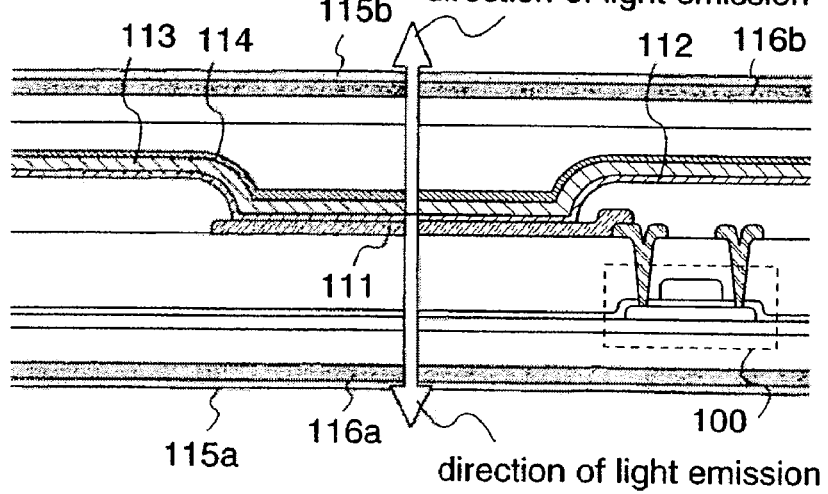

In addition, a circularly polarizing plate may be used for the dual emission type display device as shown in FIG. 9D. A circularly polarizing plate has axes of a slow axis and a fast axis as its optical axes; however, a slow axis is used in this embodiment mode. In addition, a transmission axis is used as an optical axis of a polarizing plate. For example, the first polarizing plate 115a and the first wave plate 116a are stacked, and the second polarizing plate 115b and the second wave plate 116b are stacked, which serve as a first and a second circularly polarizing plates respectively. The first and the second wave plates may be either a pair of quarter-wave plates, a pair of half-wave plates, or a combination of the both wave plates stacked together.

In particular, a transmission axis (a first transmission axis) of the first polarizing plate and a slow axis (a first slow axis) of the first quarter-wave plate, and a transmission axis (a second transmission axis) of the second polarizing plate and a slow axis (a second slow axis) of the second quarter-wave plate are each arranged at a 45° angle; the first and the second transmission axes are arranged in parallel, that is as parallel nicols; and the first and the second slow axes are arranged in parallel (FIG. 3A).

Further, the first and the second transmission axes may be arranged perpendicularly, that is, as crossed nicols, and the first and the second slow axes may be arranged perpendicularly. In other words, the first slow axis is at a 45° angle to the first transmission axis, and the slow axis of the second quarter-wave plate is at a 90° angle to the first slow axis and the transmission axis of the polarizing plate is arranged as crossed nicols. In this case, the first slow axis is at a 90° angle to the second transmission axis is at a 135° angle to the second slow axis (FIG. 3B). In the structure, a polarizing plate, a quarter-wave plate, a panel (a light-emitting element), a quarter-wave plate, and a polarizing plate are arranged in sequence.

Further, the transmission axis of the first polarizing plate (a first transmission axis) and the slow axis of the first half-wave plate, and the transmission axis of the second polarizing plate (the second transmission axis) and the slow axis of the second half-wave plate are respectively arranged at a 17.5° angle. The first transmission axis and the first slow axis of the quarter-wave plate, and the second transmission axis and the second slow axis of a quarter-wave plate are respectively arranged at a 80° angle, where the first and the second transmission axes are arranged in parallel, that is as parallel nicols, the slow axes of the first and the second half-wave plates are arranged in parallel, and the first and the second slow axes of the quarter-wave plates are also arranged in parallel (FIG. 4). The slow axis of the first quarter-wave plate and the slow axis of the second quarter-wave plate may be arranged at a 90° angle as in FIG. 3B. In such structures, a polarizing plate, a half-wave plate, a quarter-wave plate, a panel (a light-emitting element), a quarter-wave plate, a half-wave plate, and a polarizing plate are arranged in sequence.

In addition, according to Example 2, a circularly polarizing plate has a favorable effect of preventing reflected light as compared with a polarizing plate. Accordingly, when reflection from an electrode, a wiring or the like of a light-emitting element, that is reflection of external light becomes problems, a circularly polarizing plate described above may be provided preferably.

As thus described, in the invention, a polarizing plate, a circularly polarizing plate, or a combination thereof can be provided depending on a structure of a dual emission type display device. Consequently, pure black display can be performed, and the contrast can be improved. Further, reflected light can be prevented by providing a circularly polarizing plate.

Embodiment Mode 3

In this embodiment mode, a structure of a dual emission type display device different from those of FIGS. 9A to 9D in the case where a circularly polarizing plate or a polarizing plate is provided will be described.

In a dual emission type display device different from that of FIG. 9C, light is emitted from the second electrode side in a first area, and light is emitted from the first electrode side in a second area. Accordingly, a plurality of light-emitting elements and a plurality of driving TFTs are provided in one pixel; the first electrode electrically connected to the first light-emitting element is not light-transmitting and the second electrode opposed to the first electrode is light-transmitting. The first electrode electrically connected to the second light-emitting element is light-transmitting, and the second electrode opposed to the first electrode is not light-transmitting. A film containing metal or colored resin may be formed on a light-transmitting electrode so as not to be light-transmitting.

In this case, a black display can be performed purely since a non-light-transmitting material is provided. However, particularly when a metal material having high reflectivity is used for a non-light-transmitting electrode, reflection of external light can cause a problem. Therefore, a circularly polarizing plate rather than a polarizing plate may preferably be provided. A quarter-wave plate, a half-wave plate, or a laminate thereof can be provided as a wave plate of the circularly polarizing plate. The circularly polarizing plates provided in the first area and the second area may have different wave plates.

Figure 10A:
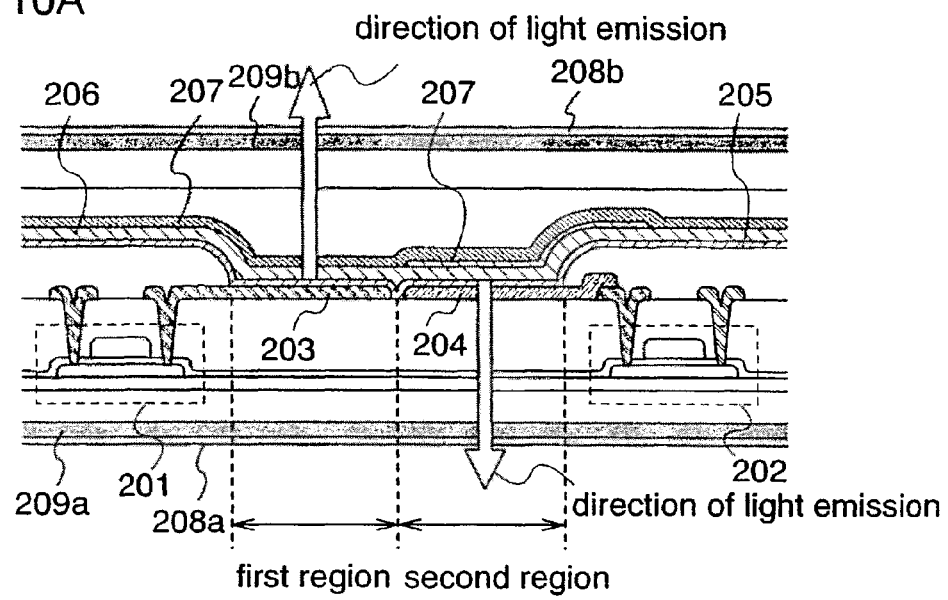
FIGS. 10A and 10B each show a dual emission type display device according to one aspect of the invention.

An enlarged sectional view of a panel is shown in FIG. 10A. A first driving TFT 201, and a first electrode 203 including a non-light-transmitting material and being connected to the first driving TFT 201 are provided in the first area. A second driving TFT 202, and a second electrode 204 including a light-transmitting material and being connected to the second driving TFT 202 are provided in the second area.

An organic compound layer 205 including a light-emitting layer is provided over the first electrode 203 and the second electrode 204; a third electrode 206 is provided over the light-emitting layer, and a film 207 including a non-light-transmitting material is further provided over the third electrode 206 in the second area. A metal material such as aluminum or titanium is used for the non-light-transmitting first electrode 203 or for the film 207 provided over the second electrode 204. Materials such as ITO are used for the light-transmitting second electrode 204 and the third electrode 206. In particular, a lamination of a first metal layer containing titanium, a second metal layer containing titanium nitride or tungsten nitride, a third metal layer containing aluminum, and a fourth metal layer containing titanium nitride may be preferably used for the second electrode 204 connecting to the semiconductor film.

The passivation film 207 containing nitrogen is formed by a sputtering method or a CVD method, thereby preventing penetration of moisture and oxygen. The space formed at this time may be filled with nitrogen and sealed, and a drying agent may be disposed inside the space. Further, the side surfaces of the display portion may be covered with the first electrode, the second electrode, and another electrode. Thereafter, a sealing substrate is attached to the substrate, and a first polarizing plate 208a and a first wave plate 209a, and a second polarizing plate 208b and a second wave plate 209b are respectively stacked, which serve as a first circularly polarizing plate and a second circularly polarizing plate, respectively.

The first and the second wave plates may be either a pair of quarter-wave plates, a pair of half-wave plates, or a combination of both wave plates stacked together. A circularly polarizing plate has axes of a slow axis and a fast axis as its optical axes; however, a slow axis is used in this embodiment mode. In addition, a transmission axis is used as an optical axis of a polarizing plate.

For example, when quarter-wave plates are respectively used for the first and the second wave plates, it is preferable that transmission axes of the first and second polarizing plates (first and second transmission axes) and slow axes of the first and second quarter-wave plates (first and second slow axes) be respectively arranged at a 45° angle to each other. Further, a first polarizing plate of a first circularly polarizing plate and a second polarizing plate of a second circularly polarizing plate are arranged as parallel nicols, in other words, a transmission axis of the first polarizing plate and a transmission axis of the second polarizing plate may be preferably arranged in parallel) (0°), and the first and the second slow axes may be arranged so as to be parallel to each other. In this embodiment mode, structures of the circularly polarizing plates shown in FIGS. 3A and 3B may be combined and the detailed structures are shown in FIGS. 3A and 3B. Further, the structures of the circularly polarizing plates respectively using a quarter-wave plate and a half-wave plate for the first and the second wave plates shown in FIG. 4 may be combined in this embodiment mode.

As another combination, it is possible that a quarter-wave plate is used for a wave plate of the first circularly polarizing plate, and a laminate of a half-wave plate and a quarter-wave plate can be used for a wave plate of the second circularly polarizing plate. It is preferable that a slow axis of the first half-wave plate and a transmission axis of the first polarizing plate (a first transmission axis) may be arranged at a 17.5° angle, and a slow axis of the first quarter-wave plate may be arranged at an angle of 2×(17.5)+45=80° with the transmission axis of the first polarizing plate. Here, as for the second circularly polarizing plate, the slow axis of the second quarter-wave plate may be arranged at an 80° angle with the transmission axis of the second polarizing plate (the second transmission axis). The transmission axis of the first polarizing plate of the first circularly polarizing plate may be arranged at 0° with the absorption axis of the second polarizing plate of the second circularly polarizing plate.

The optical axes of the polarizing plates may have angular deviation. The angular deviation may be ±45° or less, preferably, ±30° or less, and further preferably, ±10° or less, and still further preferably, ±5° or less.

Current flows between the first electrode 203 or the second electrode 204, and the third electrode 206, and light is emitted from the organic compound layer 205. Then, since the first electrode 203 containing a metal material reflects light and the second electrode 206 transmits light, light is emitted to the side of the third electrode in the first region, and light is emitted to the side of the second electrode in the second region.

In this embodiment mode, a case of providing a plurality of driving TFTs is described; however, a driving TFT can be shared by a light-emitting element in the first region and a light-emitting element in the second region by a driving method or a wiring. Further, such an organic compound layer described in Embodiment Mode 1 may be used in this embodiment mode.

Figure 10B:
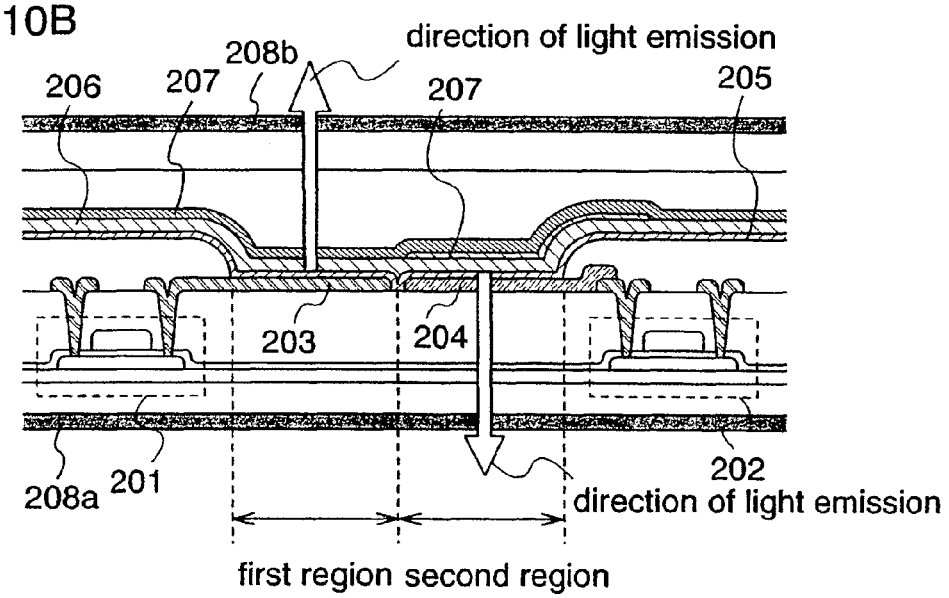

In FIG. 10B, a structure in which polarizing plates are provided instead of circularly polarizing plates and a first polarizing plate 208a and a second polarizing plate 208b are provided is shown. The polarizing plates may be provided considering the region and size of a non-light-transmitting first electrode in the first region, the region of a non-light-transmitting third electrode in the second region, and usages of display in the first region and the second region.

In FIG. 11, the circuitry of one pixel in FIGS. 10A and 10B is shown. It is shown that the organic compound layer 205 (which is shown as a light-emitting element in the circuit diagram) is each arranged in one pixel in a pixel circuit. However, a light-emitting layer can be shared by the first region and the second region as is clear from the cross-sectional view.

Figure 11A:
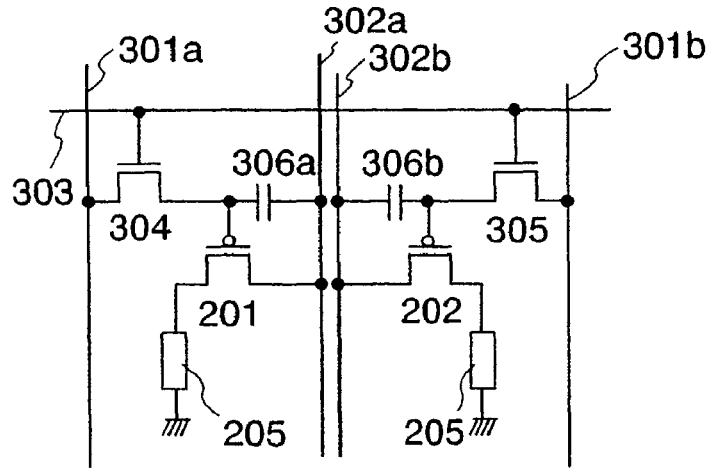
FIGS. 11A to 11C each show a circuitry of a dual emission type display device according to one aspect of the invention.

A pixel circuit shown in FIG. 11A has switching TFTs 304 and 305 which are respectively connected to a first signal line 301a and a second signal line 301b, and are connected to a scanning line 303. The pixel circuit further includes current supply lines 302a and 302b which are respectively connected to the switching TFTs 304 and 305 via capacitor elements 306a and 306b. The capacitor elements 306a and 306b each have the function of keeping the gate-source voltage of driving TFTs 201 and 202. However, a gate capacity of the driving TFTs 201 and 202 can be used as a substitute, the capacitor elements 306a and 306b may not necessarily be provided. The driving TFTs 201 and 202 are each connected to the light-emitting element 205 via the first electrode.

In such a pixel circuit, it is possible to perform a display only in the first region with the second region OFF by separately providing current supply lines. Further, different displays can be performed in the first region and the second region.

For example, in the case where different displays are performed, when a scanning line 303 is selected, video signals of respective displays are inputted from the first signal line 301a and the second signal line 301b. In addition, predetermined charges are kept in the capacitor elements 306a and 306b, and when the driving TFTs 201 and 202 are turned ON, a current is supplied to the light-emitting element, and it emits light.

When one region, for example, the first region is to be off, voltage that makes voltage inputted from a signal line be relatively zero may be input to the current supply line 302a so that a charge is not stored in the capacitor element 306a.

In FIG. 11A, a circuit diagram in which the scanning line 303 is shared by the switching TFTs 304 and 305, and the switching TFTs 304 and 305 are respectively connected to the signal lines 301a and 301b is shown; however, the signal line can be shared by providing a scanning line for each switching TFT.

The current supply line can also be shared, and in that case, the same displays are conducted in the first region and the second region.

Erasing TFTs may be provided at opposite ends of the capacitor elements 306a and 306b, so that a time gray-scale display may be performed.

Figure 11B:
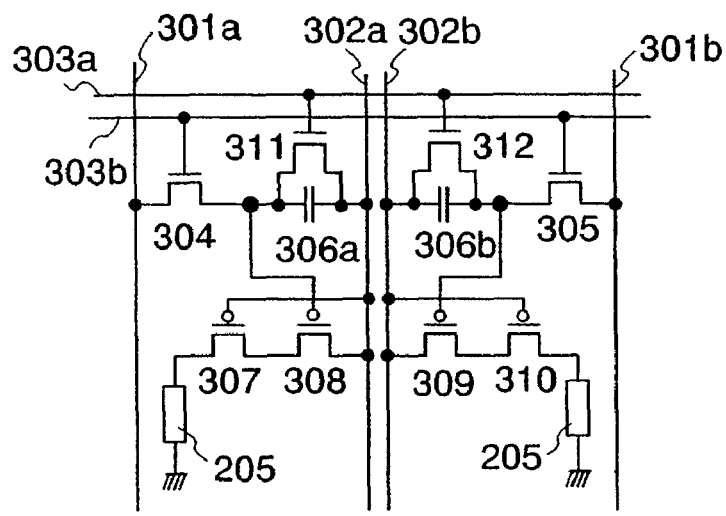

Subsequently, a pixel circuit shown in FIG. 11B has current control TFTs 308 and 309 for controlling current supply to the light-emitting element 205, as well as driving TFTs 307 and 310.

The driving TFTs 307 and 310 and the current control TFTs 308 and 309 have the same polarity. The driving TFTs 307 and 310 shall be depletion type TFTs, and the rest of the TFTs are to be normal enhancement type TFTs. In the invention, the driving TFTs 307 and 310 are operated in a saturation region and the current control TFTs 308 and 309 are operated in a linear region. The gate length (L) of the driving TFTs 307 and 310 may be longer than the gate width (W), and the L of the current control TFTs 308 and 309 may be equal to or less than the W. Desirably, the ratio of L to W (L/W) of the driving TFTs 307 and 310 is five or more.

Next, a driving method of the pixel shown in FIG. 11B will be described. The operation of the pixel shown in FIG. 11B can be divided into a writing period and a storage period. First, in the writing period, when the scanning line 303b is selected, the switching TFTs 304 and 305 whose gates are connected thereto are turned ON. Then, video signals which are inputted to the signal lines 301a and 301b is inputted to the gates of the current control TFTs 308 and 309 via the switching TFTs 304 and 305. The driving TFTs 307 and 310 are always ON as the gates are connected to the current supply lines 302a and 302b.

When the current control TFTs 308 and 309 are turned ON by a video signal, current is supplied to the light-emitting element 205 via the current supply lines 302a and 302b. At this time, the current control TFTs 308 and 309 operate in a linear region, and thus current flowing in the light-emitting element 205 is determined by volt-ampere characteristics of the light-emitting element 205 and the driving TFTs 307 and 310 operating in a saturation region. The light-emitting element 205 emits light at the luminance corresponding to the supplied current.

Meanwhile, when the current control TFTs 308 and 309 are turned OFF by a video signal, no current is supplied to the light-emitting element 205, thus it does not emit light. It is to be noted that according to the invention, it is possible to control current so as not to be supplied to the light-emitting element 205 since the current control TFTs 308 and 309 are enhancement type transistors even when the driving TFTs 307 and 310 are depletion type transistors.

In the storage period, the switching TFTs 304 and 305 are turned OFF by controlling a potential of the scanning line 303b, thereby storing a potential of the video signal that is written in the writing period. In the writing period, when the current control TFTs 308 and 309 are turned ON, a potential of a video signal is stored in the capacitors 306a and 306b, therefore, the current supply to the light-emitting element 205 is kept on. On the contrary, when the current control TFTs 308 and 309 are turned OFF in the writing period, a potential of a video signal is stored in the capacitors 306a and 306b, therefore, current is not supplied to the light-emitting element 205.

When a time gray-scale display is performed, the erasing period can be provided by erasing TFTs 311 and 312 and an erasing scanning line 303a connected to the erasing TFTs, and thus preferable for a high level gray-scale display.

Figure 11C:
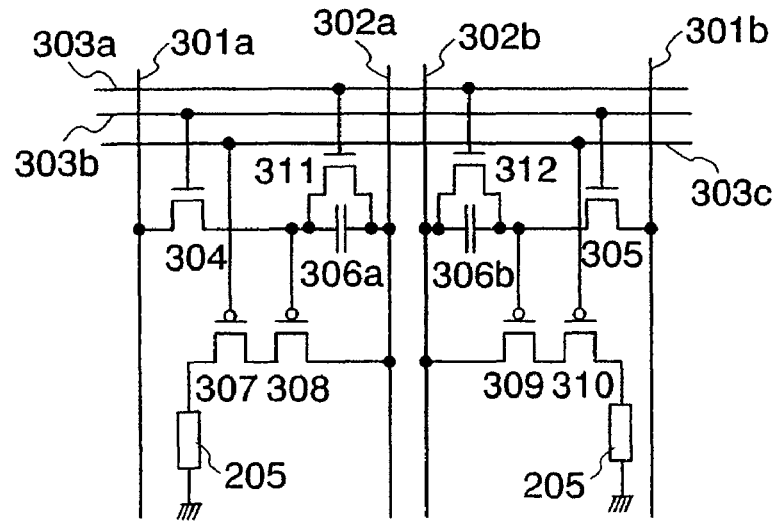

Further, in FIG. 11C, a pixel circuit in which the driving TFTs 307 and 310 are connected to a scanning line 303c is shown. The pixel circuit has the same structure as that of FIG. 11B except that gate electrodes of the driving TFTs 307 and 310 are connected to the scanning line 303c that is newly provided. Accordingly, the detailed explanation will be omitted.

First, in the writing period, when the scanning line 303b is selected, the switching TFTs 304 and 305 whose gates are connected thereto are turned ON. Then, a video signal inputted to the signal lines 301a and 301b is inputted to the gates of the current control TFTs 308 and 309 via the switching TFTs 304 and 305. At the same time, the potential of the video signal is kept in the capacitor elements 306a and 306b.

In the lighting period, when the scanning line 303c is selected, the driving TFTs 307 and 310 whose gates are connected to a second scanning line Gej (j=1 to y) are turned ON. Hereupon, when the current control TFTs 308 and 309 are turned ON by the potential of a video signal kept in the capacitor elements 306a and 306b, current is supplied to the light-emitting element 205 via the current supply lines 302a and 302b. At this time, the current control TFTs 308 and 309 operate in a linear region, thus current flowing in the light-emitting element 205 is determined by volt-ampere characteristics of the light-emitting element 205 and the driving TFTs 307 and 310 operating in a saturation region. The light-emitting element 205 emits light at the luminance corresponding to the supplied current.

Meanwhile, when the current control TFTs 308 and 309 are turned OFF by the potential of a video signal kept in the capacitor elements 306a and 306b, no current is supplied to the light-emitting element 205, thus it does not emit light.

In the non-lighting period, the driving TFTs 307 and 310 are turned OFF by the second scanning line 303c. Therefore, current is not supplied to the light-emitting element 205.

Note that the second scanning line 303c may either be selected or not be selected in writing period.

When a time gray-scale display is performed, an erasing period can be provided by erasing TFTs 311 and 312 and an erasing scanning line 303a connected to the erasing TFTs, and thus preferable for a high level gray-scale display.

As thus described, various displays can be done by using a pixel structure according to one aspect of the invention.

Pure black display can be performed by providing circularly polarizing plates or polarizing plates to make a transmittance lowest, and thus, reflected light can be prevented. Consequently, the contrast can be improved.

The invention having the above described structures will be described more in detail in Embodiments below.

Embodiment 1

An example of manufacturing a full-color dual emission type display device that is 2.1 inches in size is shown in this embodiment. A display in this embodiment can display an image in opposite screens, that is a top side and a bottom side of the display by extracting light with the same brightness from the opposite sides An organic EL element is formed as follows: a transparent electrode (such as ITO (indium tin oxide alloy), indium zinc oxide alloy ($In_2O_3$—ZnO), zinc oxide (ZnO), indium tin oxide including SiOx (ITSO)) is used as an anode, HIL (hole injecting layer), HTL (hole transporting layer), EML (light-emitting layer), ETL (electron transporting layer), EIL (electron injecting layer), and a transparent cathode (such as ITO (indium tin oxide alloy), indium zinc oxide alloy ($In_2O_3$—ZnO), zinc oxide (ZnO), indium tin oxide including SiOx (ITSO)) are laminated in this order over a substrate. Materials and thickness of these layers are selected and set as appropriate to obtain the same light-emitting characteristics on the bottom side and the top side.

In this embodiment, an ITO of 110 nm in thickness is used as the anode, and α-NPD:MoOx:rubrene of 120 nm thick as HIL and α-NPD of 10 nm thick as HTL are deposited respectively. $Alq_3$:rubrene:BisDCJTM is deposited to be 50 nm thick as a light-emitting layer that emits red light, t-Bu-DNA is deposited to be 40 nm thick as a light-emitting layer that emits blue light, and $Alq_3$: coumarin 6 is deposited to be 40 nm thick as a light-emitting layer that emits green light. $Alq_3$ of 20 nm thick for the ETL and BzOS:Li of 20 nm for the EIL are deposited respectively. The light-emitting elements that emit R, G, and B include all common layers other than the light-emitting layers. ITO is formed by a sputtering method to be 110 nm as the transparent cathode. Damages from the sputtering method in forming the transparent cathode are suppressed by using benzoxazole derivatives (BzOS).

Transmittance of the transparent cathode (ITO) is 89% to light of 530 nm in wavelength. Results that light-emitting characteristics of the bottom side and the top side of the organic EL element are plotted in a color coordinates are shown in FIG. 1.

FIG. 2 shows a cross-sectional structure of the manufactured panel.

In FIG. 2, reference numerals 400 and 408 denote light-transmitting substrates, reference numerals 401 and 409 denote optical films, reference numeral 402R denotes a TFT to be arranged in a red pixel, reference numeral 402G denotes a TFT to be arranged in a green pixel, and reference numeral 402B denotes a TFT to be arranged in a blue pixel, reference numeral 403 denotes an anode, reference numeral 404 denotes HTL (hole transporting layer), reference numerals 405R, 405G and 405B denote EMLs (light-emitting layers), reference numeral 406 denotes ETL (electron transporting layer), and reference numeral 407 denotes a transparent cathode. Note that a stripe arrangement, a delta arrangement, a mosaic arrangement and the like can be given as the pixel electrode arrangement.

The TFTs 402R, 402G and 402B are each a top gate TFT having a polysilicon film as an active layer. A semiconductor film having an amorphous structure is formed by a known method (such as a sputtering method, an LPCVD method, a plasma CVD method), and then crystallized by a known crystallization method (such as a laser crystallization method, a thermal crystallization method, or a thermal crystallization method using a catalyst such as nickel) to form a polysilicon film. In this embodiment, it is crystallized by employing a crystallization method using nickel as a metal element promoting silicon to crystallize to obtain a polysilicon film herein, and then, gettering for removing nickel is conducted.

The invention is applicable to any TFT structure without limiting to a top gate TFT. For example, the invention can be applied to a bottom gate (inversely staggered) TFT, or a staggered TFT. Further, a multigate TFT having plural channel forming regions, e.g., a double gate TFT may be employed without being limited to a single gate TFT.

A source driver, a gate driver and a pixel portion circuit are formed integrally by using the TFTs. A digital driving system time division gray-scale control is employed as the driving method.

A specification thereof is shown in FIG. 3.

TABLE 3

| | Specifications |
|---|---|
| Screen Diagonal | 2.1 inch (for cell-phone) |
| Pixels | 176 × RGB × 220 (QCIF+) |
| Pixel Pitch (Pixel/Inch) | 0.063 mm × 0.189 mm × RGB (134 ppi) |
| Pixel Aspect Ratio | 4:05 |
| Pixel Arrangement | Stripe |
| Driving Method | Active Matrix |
| Number of Colors | 262,144 colors |
| Gray-scale | 64 (6 bits) |
| Aperture Ratio | 41% |
| Thickness of Display | 1.5 mm (including optical film) |
| Direction of Light Emission | Dual Emission |
| Color System | RGB Separate deposition method |
| Power Consumption | 280 mW (300 cd/m$^2$, 30% emitting) |

As for a dual emission type display device, a transmission type display in which a display is see-through, and a non-transmission type display that can obtain a favorable image without being adversely affected by external light in any direction of a top face and a bottom face by a combination with an optical film (a polarizing plate or a wave plate) can be used appropriately depending on an application.

Figure 12A:
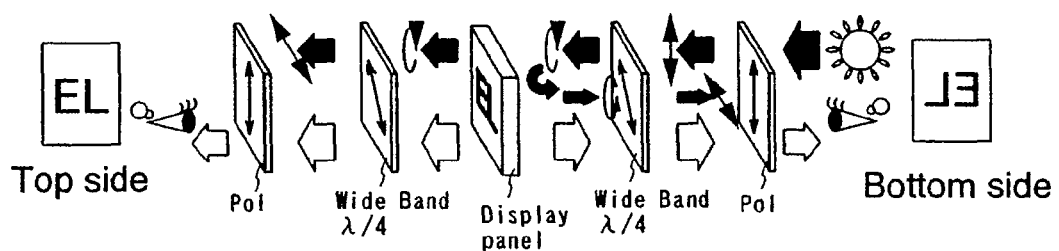
FIGS. 12A and 12B each show an arrangement of a polarizing plate of Embodiment 1.

FIG. 12A shows a structure that prevents reduction of contrast due to transmitted light and reflected light of external light. As transmitted light, unnecessary light that has become linear light by a polarizing plate on an incident side passes through quarter wave plates twice, and thus it is given an optical modulating action equivalent to a half wave plate. Thus, linear polarized light of unnecessary light turns at 90°, and enters a polarizing plate on an emitting side and conforms to an absorption axis of the polarizing plate to be absorbed. In FIG. 12A, a rotation direction of an arrow of the light that has passed through the quarter wave plate is shown by a slow axis.

As unnecessary light that has been reflected on a reflector inside a display, linear polarized light that has passed through the polarizing plate passes through the quarter wave plate, then, becomes circular polarized light and is reflected on an reflector. The reflected circular polarized light enters the same quarter-wave plate again, and the relation is regarded to be similar to the above described case of transmitted light. The light emitted from the quarter wave plate, through which the light has passed again, becomes linear polarized light and turns at 90°. Thus, the light reaches the polarizing plate on the incident side, but is absorbed by the absorption axis. This makes it possible to prevent the unnecessary light from adversely affecting on observing an image. An image from the display is random light, and light excluding a component that conforms to the absorption axis of the polarizing plate, passes through the quarter wave plate and reaches an observer.

Figure 12B:
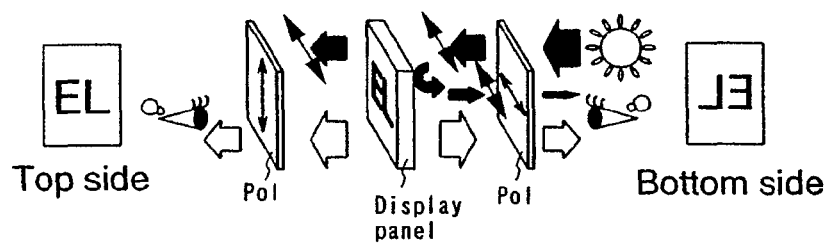

FIG. 12B shows an example of using a polarizing plate only. In FIG. 12B, transmitted unnecessary light is shown. The light is absorbed by an absorption axis of the polarizing plate on an emitting side that is arranged as crossed nicols. 60% or more of reflected unnecessary light that is reflected inside a display can be reduced by passing through polarizing plates twice, and thus contrast is expected to be enhanced.

Such systems have each one feature of a structure in which the same optical action can be obtained on the both sides. Further, a non-reflecting treatment or the like may be added to obtain a better effect.

Table 4 shows optical characteristics of the transmission type and the two types of non-transmission type specifications described above. Type A is a system of FIG. 12A and Type B is a system of FIG. 12B.

TABLE 4

|  | Transparent type | Transparent type Type-A | Transparent type Type-B |
| --- | --- | --- | --- |
| Contrast under Room Lighting (Bottom side) | 10 | 400 | 40 |
| White Coordinate (TOP/BOTTOM) | (0.29, 0.30)/ (0.31, 0.30) | (0.30, 0.32)/ (0.31, 0.32) | (0.30, 0.32)/ (0.31, 0.33) |
| Luminance Ratio (TOP/BOTTOM) | 0.96 | 0.94 | 0.92 |
| Transmittance of Display | 31% | 0.14% | 0.08% |

As shown in Table 4, the almost same luminance and chroma from a top side and a bottom side can be obtained in a transmission type display and a non-transmission display by optically adjusting laminated films inside a panel and employing a transparent cathode.

The non-transmission type specification can obtain higher contrast than the transmission type specification in an indoor environment. On the contrary, luminance of an image light is reduced by half or less since an optical system using a polarizing plate is employed.

Even in the non-transmission type specification, contrast characteristics are greatly different depending on structures of optical films (Types A and B). Type A in which a polarizing plate and a wave plate are arranged employs an optical structure that can realize an action that external light is prevented from reflecting on a wiring or the like inside a substrate and an action that light transmitted through a display is absorbed at the same time.

Accordingly, Type A can obtain higher contrast (400 or higher in indoor lightning) than Type B in which a polarizing plate is crossed nicols only, since Type A is not affected by external light by reflection.

In a display having a higher aperture ratio or a structure in which inside reflection is suppressed, even Type B can be expected to obtain similar characteristics to those of Type A.

For example, in the case where a display panel of this embodiment is installed in a digital still camera, an image to be photographed can be confirmed and shot even when facing a subject.

Usages in a folded state and an open state are possible with one panel without a complicated folding mechanism by a combination with a folding type electronic device such as e.g., a cellular phone or a PDA.

Figure 13:
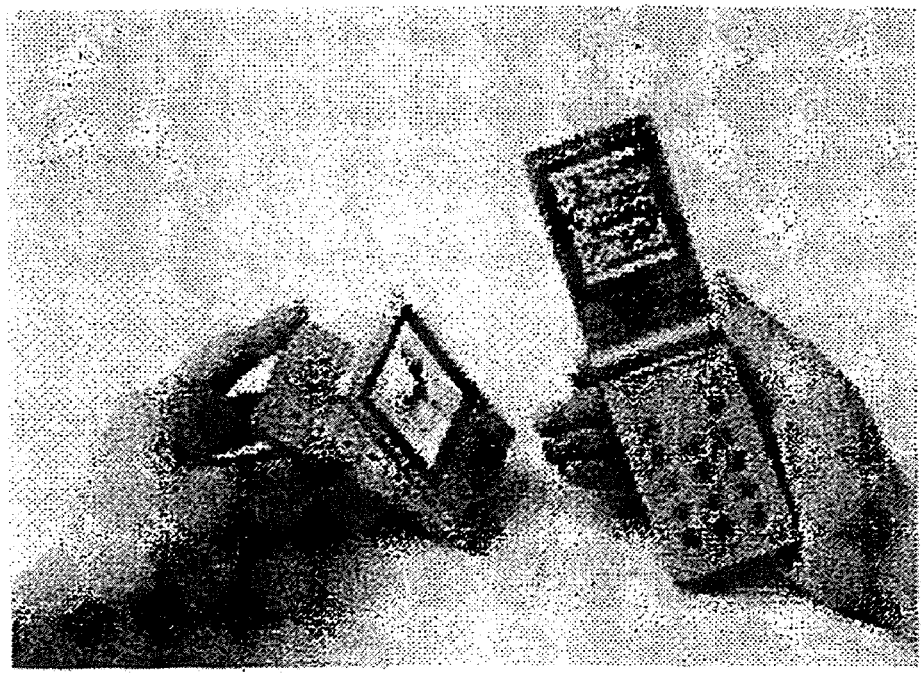
FIG. 13 is a photograph of a cellular phone appearance.

An appearance photograph of a cellular phone installing a panel of this embodiment is shown in FIG. 13.

In addition, a double-sided display is possible with one display panel, and thus, a driving circuit system may be one system, thinning and reducing in weight can be achieved as well as electric power saving.

Embodiment 2

Various electronic devices can be completed by installing a dual emission type display device according to the invention. Such electronic devices include video cameras, digital cameras, goggle type displays (head mounted displays), navigation systems, audio reproducing apparatuses (car audios, audio components, etc.), laptop computers, game machines, personal digital assistants (mobile computers, cellular phones, portable game machines, electronic books, etc.), image reproducing apparatuses equipped with a recording medium (specifically, devices equipped with displays each of which is capable of playing a recording medium such as a digital versatile disc (DVD), and displaying the image thereof), and the like.

Figure 14A:
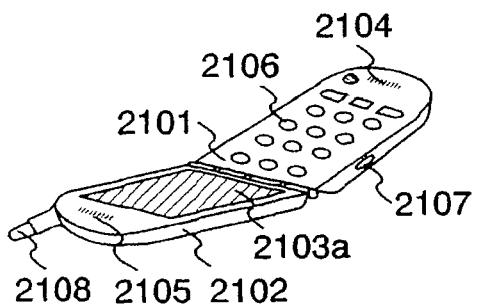
Figure 14A:
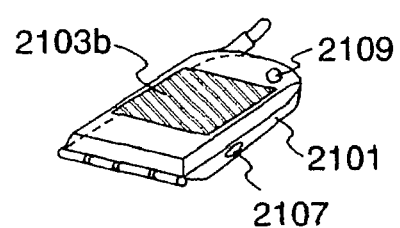

FIG. 14A shows an example a dual emission type display device (a double sided display type panel) is installed in a folding type cellular phone.

FIG. 14A is a perspective view of a cellular phone, and FIG. 14B is also a perspective view of a folded cellular phone. The cellular phone comprises a main body 2101, a casing 2102, display portions 2103a and 2103b, an audio input portion 2104, an audio output portion 2105, operation keys 2106, an external connection port 2107, an antenna 2108, and an imaging portion 2109 and the like.

The cellular phones shown in FIGS. 14A and 14B include the display portions 2103a and 2103b that both display high-definition full color image. The display portions 2103a and 2103b are each formed of one panel (a dual emission type panel), and thus, an electronic device having plural display screens can be thinner and lighter, and the number of parts can be reduced.

A dual emission type display device described in any one of Embodiment Modes 1 to 3 can be used for the dual emission type panel, and optical films (such as a polarizing plate, a quarter wave plate and a half wave plate) are arranged appropriately.

The display portion 2103a and the display portion 2103b have the same size, and a video signal is also common for the display portions. When a display is done in the display portion 2103a, the display becomes mirror-reversed to be displayed in the display portion 2103b. Typically, since a user sees only the display portion 2103b in the folded state, and sees only the display portion 2103a in the open state, the display may be shifted to be mirror-reversed depending on a state of the cellular phone in-order so that the user can see it.

The cellular phone shown in FIGS. 14A and 14B can photograph a still image or a moving image with the imaging portion 2109 (such as CCD). The display portion 2103b is provided also for the imaging portion 2109 side, and thus, a subject can be displayed in the display portion 2103b. Accordingly, when a user of the cellular phone photographs his/her face, he/she can push a shutter confirming an image to be photographed in real-time, which is convenient.

Figure 14C:
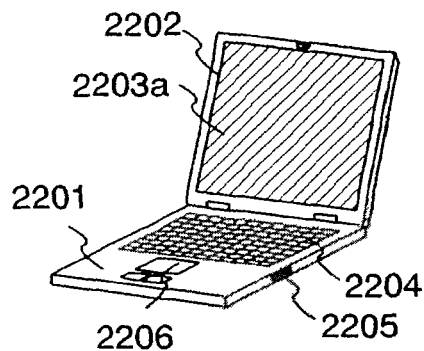
Figure 14C:
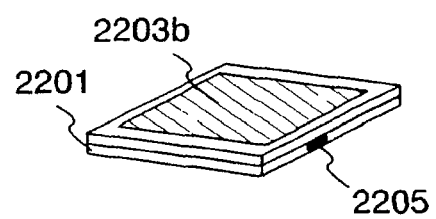

FIG. 14C is a perspective view of a laptop computer, and FIG. 14D is also a perspective view of a folded laptop computer. The lap top computer comprises a main body 2201, a casing 2202, display portions 2203a and 2203b, a keyboard 2204, an external connection port 2205, a pointing mouse 2206, and the like.

The laptop computers illustrated in FIGS. 14C and 14D are equipped with the display portion 2203a that displays a high-definition full-color image in an open state and the display portion 2203b that displays a high-definition full-color image in a folded state. Accordingly, a user can see a display in the display portion 2203b while he/she is carrying the lap top computer with it folded. Users can use it like an electronic book, which is convenient.

Figure 14E:
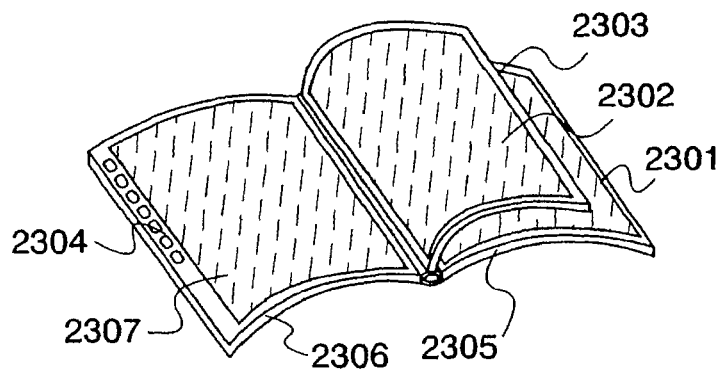

FIG. 14E shows a case where a dual emission type display device (a double side display panel) is combined with a display portion of an electronic device, although it can be used as one display portion as electronic devices shown by FIGS. 14A to 14D.

Specifically, when a dual emission type display device (a double side display panel) is provided for a flexible substrate such as a plastic substrate, a thickness of a casing can be suppressed and flexibility thereof can be enhanced.

FIG. 14E shows an example of an electronic book having a double-sided display panel 2303. A first casing 2305 includes a first display portion 2301 (a first display screen); a double-sided display panel 2303 includes a second display screen and a third display screen 2302; a second casing 2306 includes operation keys 2304 and a second display portion 2307 (a fourth display screen); and the double-sided display panel 2303 is sandwiched between the first casing and the second casing. A display panel having a light-emitting element or a liquid crystal element can be used for the first display portion 2301 and the second display portion 2307.

As a usage example of an electronic book using the double-sided display panel 2303, texts are displayed in the first and third display screens and a figure is displayed in the fourth display screen, which is convenient. At the time, the double-sided display panel 2303 cannot display an image in the second and third display screens 2302 simultaneously, and thus, a display in the second display screen is shifted into one in the third display screen when a user begins to turn a page.

The user reads a content of the first display screen in the first display portion 2301, and a content of the second display screen on the next page. Then, when he/she begins to turn the double-sided display panel, a third display screen and a fourth display screen displays a content of the next page at a certain angle. Further, when he/she finishes reading contents of the third display screen 2302 and the fourth display screen and turns the double-sided display panel, the first display screens displays a content of the next page at a certain angle. In this way, it is prevented to see shifting of a screen and a visible sense of discomfort or the like can be suppressed. A dual emission panel using a flexible substrate may be used to reduce the sense of discomfort more. In the case of using such a dual emission panel using a flexible substrate, further reduction in weight is realized, so that a double-sided display panel is more easily turned.

The first display portion 2301 provided for the first casing 2305 may be a double-sided display panel, and the second display portion 2307 provided for the second casing 2306 may be a double-sided display panel. In that case, an electronic book having six display screens in total can be obtained, since two display screens of the first display portion 2301 and two display screens of the second display portion 2306 are obtained.

An electronic book having one double-sided display panel 2303 is shown in FIG. 14E, but an electronic book having plural double-sided display panels may be formed.

Figure 15A:
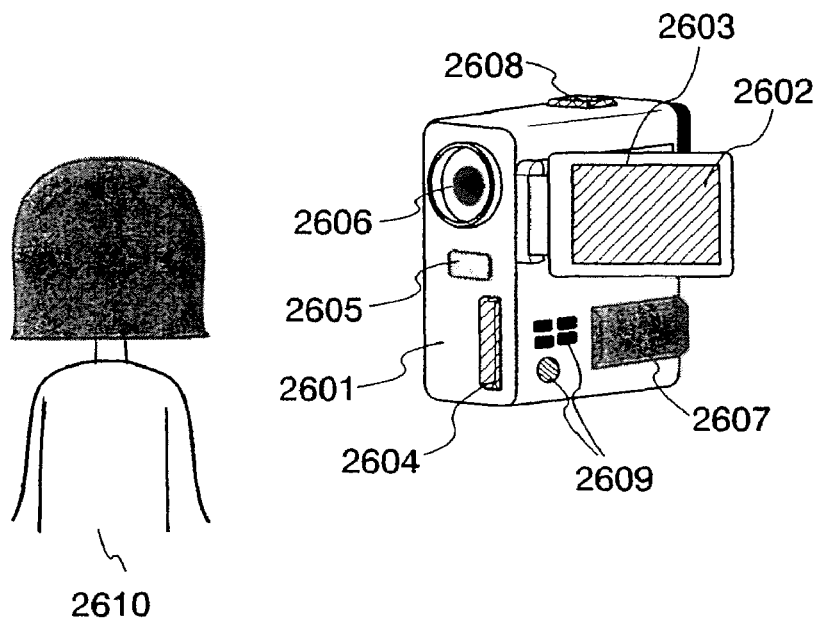
FIGS. 15A to 15C each show an electronic device including a dual emission type display device according to one aspect of the invention.

FIG. 15A shows a digital video camera, which includes a main body 2601, a display portion 2602, a casing 2603, a external connection port 2604, a remote controller receiving portion 2605, an image receiving portion 2606, a battery 2607, an audio input portion 2608, operation keys 2609 and the like.

A double-sided display panel is provided for the display portion 2602. Note that the double-sided display panel includes a light-emitting element, and is provided with an optical film of a combination shown in Embodiment Modes 1 to 3.

Specifically, when a user photographs himself/herself with a digital video camera of this embodiment, he/she is displayed in the dual emission type panel. This is because in the dual emission type panel, it is possible that an imaged received from a receiving portion can be seen and confirmed in the display portion 2602 while an imaging portion faces the user, without inverting the casing 2603.

Figure 15B:
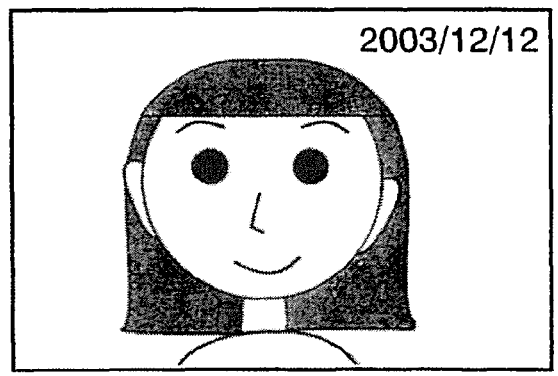
Figure 15C:
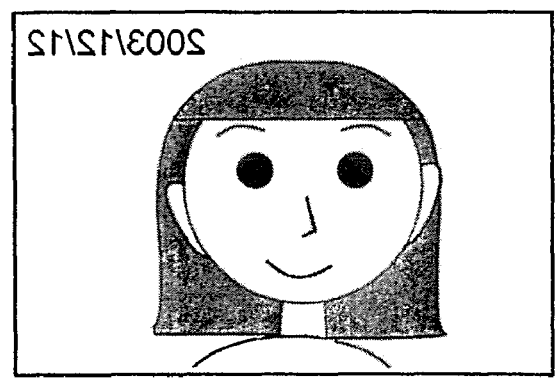

Further, when a photographer (user) (not shown) photographs a subject 2610, an image of the subject can be displayed as shown in FIG. 15B without inverting the casing 2603 in the case of seeing the display portion on the user's side. On the other hand, an image of the display portion 2602 shown in FIG. 15C can be seen in the subject's side. The image of FIG. 15B is displayed mirror-reversibly as the image on the subject's side as shown in FIG. 15C. Although an image on one side is mirror-reversed and characters are not easily read, the mirror-reversed image is sufficient as long as an arrangement of a subject can be confirmed in a screen in photographing with a video camera or the like.

In addition, a photographer (user) or a subject 2610 can select any one of images in FIGS. 15B and 15C for confirmation.

Like this, it is not necessary to turn a panel in the case of using a double-sided display panel for a digital video camera. If one panel for displaying an image in one screen is turned so that a subject can confirm the image instead of using double-sided display panel, it becomes complicated. Further, in the panel having one screen, it is impossible that a photographer and a subject (a person to be photographed) can see an imaged displayed in the panel at the same time.

When a user (photographer) photographs himself/herself with e.g. a digital camera as well as a digital video camera, it is possible to confirm the user's (photographer's) image by himself/herself without inverting the casing by providing a dual emission type panel. In this case, like the digital video camera shown in FIG. 15A, the digital camera has a casing that can be folded and that has a display portion and the casing having the display portion can be separated from the main body of the digital camera.

When a subject 2610 is photographed by a photographer even with a digital video camera, the photographer and the subject 2610 can confirm an image of the display portion 2602 since it is a dual emission type panel.

Figure 16A:
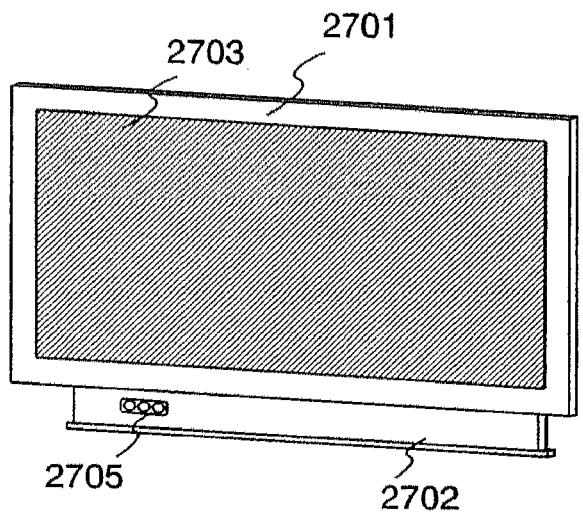
FIGS. 16A to 16C each show an electronic device including a dual emission type display device according to one aspect of the invention.

FIG. 16A shows a large sized double-sided display device having a large screen of 22 to 50 inches, which includes a casing 2701, a support 2702, a display portion 2703, a video input terminal 2705 and the like. Note that display devices include all display devices for displaying information such as one for a personal computer, one for receiving a television broadcasting, and one for a bi-direction TV. According to the invention, a thin and light display device that can conduct a pure black display and a pure full-color display can be realized even when it is a large sized double-sided display device having a large screen.

Figure 16B:
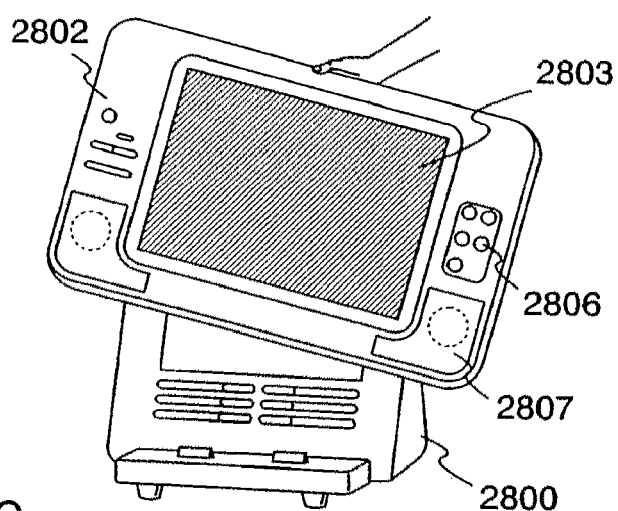

FIG. 16B shows a wireless TV having a portable display. A battery and a signal receiver are built-in in a casing 2802, and a display portion 2803 or a speaker portion 2807 is driven by the battery. The battery can be charged repeatedly by a charger 2800. The charger 2800 can conduct a transmission and reception of a video signal and transmit the video signal to a signal receiver of a display. A casing 2802 can be controlled by operation keys 2806. The device shown in FIG. 16B can be also regarded as a video-audio bi-directional communication device, since a signal can be transmitted to the charger 2800 from the casing 2802 by operating the operation keys 2806. Further, the device can be also regarded as an all-purpose remote-control device, since it is possible that a signal can be transmitted to the charger 2800 from the casing 2802 and a signal that the charger 2800 can transmit is received by another electronic device by operating the operation keys 2806, thereby controlling communication of another electronic device. According to the invention, a TV that is light enough to be portable and that can conduct a double-sided display can be realized even when it is comparatively large (22 to 50 inches)

Figure 16C:
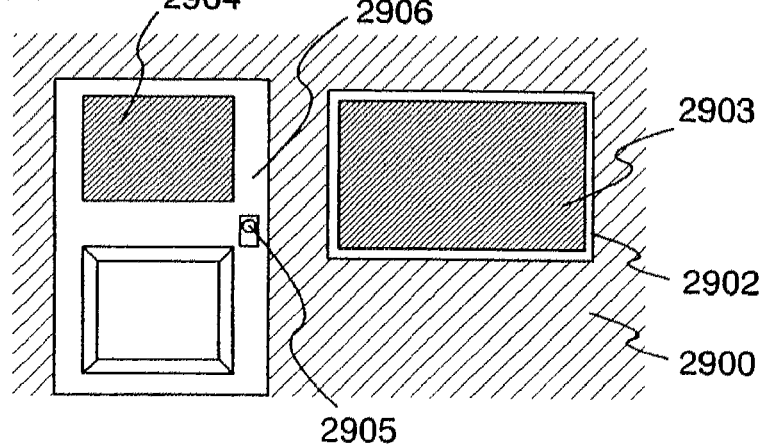

FIG. 16C shows an example of installing a dual emission type display device in an external wall 2900 or a door 2906 in a shop or a building such as an eating and drinking place or a clothing store. For example, a passer-by on a street and a person in a shop can see an image (a display for advertisement information) displayed in a display portion 2903 at the same time, when a dual emission type display device is installed in a frame 2902 of the external wall 2900 facing the street, like a window, in a shop. Therefore, using a dual emission type display device makes it possible to use the display as a store window for giving merchandise information to more people, namely, not only people outside the shop but also people inside the shop. The power consumption of one panel is needed even in the case of a double-sided display, and advertisement information can be confirmed in a wide area around the display screens, which is useful.

Similarly, in the case of installing the display portion 2904 in the door 2906 by providing a dual emission type display device, the dual emission type display device can also serve as a store window. When the door 2906 is closed or open fully to be inside out, the display can be seen and confirmed since it is a dual emission type display device. In addition, reference numeral 2905 is a handle. Even when the dual emission type display device is installed like a sign, advertisement information can be seen and confirmed in a wide area around the display screens, which is useful.

This embodiment can be freely combined with any one of Embodiment Modes 1 to 3 and Embodiment 1.

A dual emission type display device that can conduct favorable black display and full-color display can provide a new application or a new market. For instance, it can be applied to a store window and the like. Therefore, application range thereof is extremely wide without limiting to a cellular phone.

This application is based on Japanese Patent Application serial no. 2003-417382 filed in Japan Patent Office on 15, Dec., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A light-emitting device comprising:
    a first light-emitting element configured to emit red light;
    a second light-emitting element configured to emit green light;
    a third light-emitting element configured to emit blue light;
    a first polarizing plate arranged on a front side of the first light-emitting element, the second light-emitting element and the third light-emitting element; and
    a second polarizing plate arranged on a rear side of the first light-emitting element, the second light-emitting element and the third light-emitting element,
    wherein each of the first light-emitting element, the second light-emitting element and the third light-emitting element includes:
        a cathode;
        a first layer containing a first organic compound;
        a second layer having a hole injecting property containing a metal oxide and a second organic compound;
        a light emitting layer in contact with said first layer; and
        an anode in contact with the second layer,
    wherein each of the anode and the cathode of the first light-emitting element, the second light-emitting element and the third light-emitting element is a light-transmitting conductive film, and
    wherein the second organic compound includes an aromatic amine based compound.

2. The light-emitting device according to claim 1, wherein the light-transmitting conductive film comprises a material selected from a group consisting of indium tin oxide alloy, indium zinc oxide alloy, zinc oxide, and indium tin oxide including SiOx.

3. The light-emitting device according to claim 1, wherein the first organic compound and the second organic compound comprise the same material.

4. The light-emitting device according to claim 1, wherein the metal oxide is selected from a group consisting of molybdenum oxide, vanadium oxide, ruthenium oxide and tungsten oxide.

5. An electronic device including the light-emitting device according to claim 1, wherein the electronic device is a personal digital assistant, a video camera, a digital camera, a digital video camera or a personal computer.

6. A light-emitting device comprising:
    a first light-emitting element configured to emit red light;
    a second light-emitting element configured to emit green light;
    a third light-emitting element configured to emit blue light;
    a first polarizing plate arranged on a front side of the first light-emitting element, second light-emitting element and the third light-emitting element;
    a first quarter-wave plate arranged between the first light-emitting element and the first polarizing plate, the second light-emitting element and the first polarizing plate, and the third light-emitting element and the first polarizing plate;
    a second polarizing plate arranged on a rear side of the first light-emitting element, second light-emitting element and the third light-emitting element; and
    a second quarter-wave plate arranged between the first light-emitting element and the second polarizing plate, the second light-emitting element and the second polarizing plate, and the third light-emitting element and the second polarizing plate,
    wherein each of the first light-emitting element, the second light-emitting element and the third light-emitting element includes:
        a cathode;
        a first layer containing a first organic compound;
        a second layer having a hole injecting property containing a metal oxide and a second organic compound;
        a light emitting layer in contact with said first layer; and
        an anode in contact with the second layer,
    wherein each of the anode and the cathode of the first light-emitting element, the second light-emitting element and the third light-emitting element is a light-transmitting conductive film, and
    wherein the second organic compound includes an aromatic amine based compound.

7. The light-emitting device according to claim 6, wherein the light-transmitting conductive film comprises a material selected from a group consisting of indium tin oxide alloy, indium zinc oxide alloy, zinc oxide, and indium tin oxide including SiOx.

8. The light-emitting device according to claim 6, wherein the first organic compound and the second organic compound comprise the same material.

9. The light-emitting device according to claim 6, wherein the metal oxide is selected from a group consisting of molybdenum oxide, vanadium oxide, ruthenium oxide and tungsten oxide.

10. An electronic device including the light-emitting device according to claim 6, wherein the electronic device is a personal digital assistant, a video camera, a digital camera, a digital video camera or a personal computer.

11. A light-emitting device comprising:
a first light-emitting element configured to emit red light;
a second light-emitting element configured to emit green light;
a third light-emitting element configured to emit blue light;
a first polarizing plate arranged on a front side of the first light-emitting element, second light-emitting element and the third light-emitting element;
a first quarter-wave plate arranged between the first light-emitting element and the first polarizing plate, the second light-emitting element and the first polarizing plate, and the third light-emitting element and the first polarizing plate;
a first half-wave plate arranged between the first polarizing plate and the first quarter-wave plate;
a second polarizing plate arranged on a rear side of the first light-emitting element, second light-emitting element and the third light-emitting element;
a second quarter-wave plate arranged between the first light-emitting element and the second polarizing plate, the second light-emitting element and the second polarizing plate, and the third light-emitting element and the second polarizing plate; and
a second half-wave plate arranged between the second polarizing plate and the second quarter-wave plate,
wherein each of the first light-emitting element, the second light-emitting element and the third light-emitting element includes:
a cathode;
a first layer containing a first organic compound;
a second layer having a hole injecting property containing a metal oxide and a second organic compound;
a light emitting layer in contact with said first layer; and
an anode in contact with the second layer,
wherein each of the anode and the cathode of the first light-emitting element, the second light-emitting element and the third light-emitting element is a light-transmitting conductive film, and
wherein the second organic compound includes an aromatic amine based compound.

12. The light-emitting device according to claim 10, wherein the light-transmitting conductive film comprises a material selected from a group consisting of indium tin oxide alloy, indium zinc oxide alloy, zinc oxide, and indium tin oxide including SiOx.

13. The light-emitting device according to claim 11, wherein the first organic compound and the second organic compound comprise the same material.

14. The light-emitting device according to claim 11, wherein the metal oxide is selected from a group consisting of molybdenum oxide, vanadium oxide, ruthenium oxide and tungsten oxide.

15. An electronic device including the light-emitting device according to claim 11, wherein the electronic device is a personal digital assistant, a video camera, a digital camera, a digital video camera or a personal computer.

16. A light-emitting device comprising:
a substrate;
a plurality of light-emitting elements formed over the substrate, each of the plurality of light-emitting elements comprising:
a cathode;
a first layer containing a first organic compound;
a second layer having a hole injecting property containing a metal oxide and a second organic compound;
a light emitting layer in contact with said first layer; and
an anode in contact with the second layer,
wherein each of the anode and the cathode of the plurality of light-emitting elements is transparent to light emitted from the plurality of light-emitting elements,
wherein a first polarizing plate and a second polarizing plate are provided opposed to each other with the plurality of light-emitting elements interposed therebetween, and
wherein the second organic compound includes an aromatic amine based compound.

17. The light-emitting device according to claim 16, wherein the first organic compound and the second organic compound comprise the same material.

18. The light-emitting device according to claim 16, wherein the metal oxide is selected from a group consisting of molybdenum oxide, vanadium oxide, ruthenium oxide and tungsten oxide.

19. An electronic device including the light-emitting device according to claim 16, wherein the electronic device is a personal digital assistant, a video camera, a digital camera, a digital video camera or a personal computer.

* * * * *